United States Patent
Ll et al.

(10) Patent No.: US 12,184,237 B2
(45) Date of Patent: Dec. 31, 2024

(54) SURFACE-MOUNT AMPLIFIER DEVICES

(71) Applicant: NXP USA, Inc., Austin, TX (US)

(72) Inventors: Lu Ll, Gilbert, AZ (US); Li Ll, Scottsdale, AZ (US); Lakshminarayan Viswanathan, Phoenix, AZ (US); Zhiwei Gong, Chandler, AZ (US); Fernando A. Santos, Chandler, AZ (US); Elie A. Maalouf, Mesa, AZ (US); Eduard Jan Pabst, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 526 days.

(21) Appl. No.: 17/516,360

(22) Filed: Nov. 1, 2021

(65) Prior Publication Data

US 2023/0133034 A1 May 4, 2023

(51) Int. Cl.
| | |
|---|---|
| *H03F 1/02* | (2006.01) |
| *H03F 3/193* | (2006.01) |
| *H03F 3/195* | (2006.01) |
| *H03F 3/213* | (2006.01) |

(52) U.S. Cl.
CPC ......... *H03F 1/0288* (2013.01); *H03F 3/193* (2013.01); *H03F 3/195* (2013.01); *H03F 3/213* (2013.01)

(58) Field of Classification Search
CPC ........ H03F 1/0288; H03F 3/193; H03F 3/195; H03F 3/213; H03F 2200/451; H01L 23/3677; H01L 23/49531; H01L 23/4334; H01L 23/49805; H01L 23/49811; H01L 23/5383; H01L 2224/48137; H01L 2224/48227; H01L 2224/49111; H01L 2224/49175; H01L 2924/181; H01L 2924/19105; H01L 23/13; H05K 3/284; H05K 3/4697; H05K 1/021; H05K 1/183; H05K 1/0237; H05K 2201/10416;
(Continued)

(56) References Cited

U.S. PATENT DOCUMENTS

| | | |
|---|---|---|
| 6,072,238 A | 6/2000 | Viswanathan et al. |
| 6,078,101 A | 6/2000 | Aizenberg et al. |
| 9,629,246 B2 | 4/2017 | Mu et al. |

(Continued)

OTHER PUBLICATIONS

"Mitsubishi RF Power Module M68776"; Decapped Photo (Jun. 3, 2021).
(Continued)

*Primary Examiner* — Hieu P Nguyen

(57) ABSTRACT

A device includes a package body including a central flange and an amplifier module mounted to the central flange of the surface-mount device. The amplifier module includes a module substrate mounted to the central flange. The module substrate includes a first die mount window, a first circuitry on a first surface of the module substrate, a second circuitry on the first surface of the module substrate, and a first amplifier die mounted on the central flange. The first amplifier die is at least partially disposed within the first die mount window and the first amplifier die is electrically connected to the first circuitry and the second circuitry. The first circuitry is electrically connected to a first lead of the package body and the second circuitry is electrically connected to a second lead of the package body.

20 Claims, 12 Drawing Sheets

(58) Field of Classification Search
CPC ....... H05K 1/0204; H05K 2201/10969; H05K 1/181; H05K 3/341
USPC ...................................... 330/295, 124 R, 307
See application file for complete search history.

(56) References Cited

U.S. PATENT DOCUMENTS

| | | |
|---|---|---|
| 9,647,611 B1 * | 5/2017 | Embar .................. H03F 1/0288 |
| 10,117,340 B2 | 10/2018 | Hsu et al. |
| 10,440,813 B1 | 10/2019 | Li et al. |
| 2007/0041163 A1 | 2/2007 | Jouan et al. |
| 2018/0240748 A1 | 8/2018 | Hu et al. |
| 2018/0270960 A1 | 9/2018 | Mswanathan et al. |
| 2021/0313283 A1 | 10/2021 | Wilson et al. |
| 2023/0115340 A1 * | 4/2023 | Wei .................. H01L 23/49811 257/676 |

OTHER PUBLICATIONS

"Mitsubishi RF Power Module M68776"; retrieved from Internet https://www.digchip.com/datasheets/parts/datasheet/305/M68776-pdf.php; 2 pages (Jul. 23, 2021).

* cited by examiner

SURFACE-MOUNT AMPLIFIER DEVICES

TECHNICAL FIELD

Embodiments of the subject matter described herein relate generally to amplifiers, and more particularly to amplifiers packaged in surface-mount devices.

BACKGROUND

Amplifiers in various configurations and architectures are found in many electronic devices. In wireless communication systems, for example, the Doherty power amplifier is ubiquitous within cellular base station transmitters because the Doherty power amplifier architecture is known to improve efficiency, when compared with other types of amplifiers.

Trends toward higher and higher operational frequencies (e.g., in the gigahertz (GHz) range), higher power operation, and increased system miniaturization present challenges to the design of conventional electronic devices that may include amplifier devices, particularly in the area of semiconductor package design. As frequencies and power levels continue to increase, effective amplifier implementations are needed that enable high efficiency operation in low cost and small footprint solutions where thermal energy build-up can be problematic. Similarly, in other applications, electronic devices providing non-amplifier functionality may face similar design pressures in the desire to increase power and frequencies of operation, while providing small footprint solutions.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
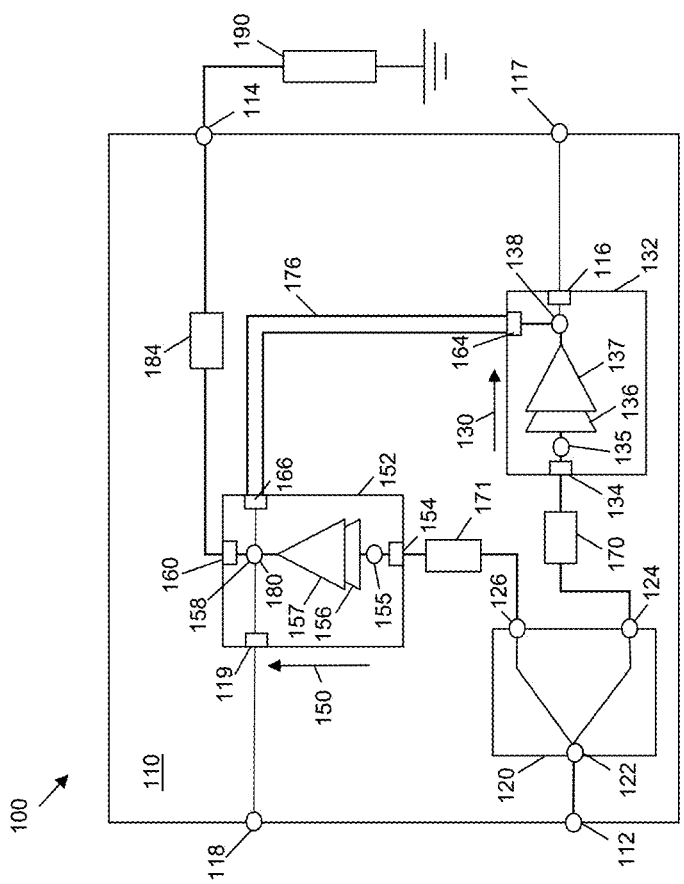
FIG. 1 is a schematic diagram of a Doherty amplifier, in accordance with an example embodiment.

Amplifier devices include a number of circuit components configured to process an input signal, amplify that input signal, and generate an appropriate output signal. Amplifiers can be single or multiple stage and may include one or more paths of signal amplification. For example, a two-way Doherty power amplifier includes a signal splitter with an input and two outputs, where each splitter output is connected to an input of a carrier amplifier or a peaking amplifier. The carrier and peaking amplifier outputs are electrically connected to a combining node, which is configured to combine (in phase) the amplified output signals from the carrier and peaking amplifiers. More particularly, in a "0-90" Doherty power amplifier, the output of one of the amplifiers is directly connected to the combining node, where the direct connection is desirably characterized by about 0 degrees of phase shift. Conversely, the output of the other amplifier is coupled to the combining node through an impedance inverter, which is characterized by about 90 degrees of phase shift. Typically, the impedance inverter consists of a series of conductive structures, including an impedance inverter line (e.g., a transmission line on a printed circuit board (PCB)). Doherty power amplifiers implemented in integrated packages often have stringent size constraints that dictate the potential physical length of the impedance inverter line. Generally, it is desirable from a loss standpoint to make the impedance inverter line as compact as possible.

During operation, components of RF amplifiers can generate substantial amounts of heat, which must be dissipated. In some amplifier designs, amplifiers may be implemented by a number of components that are directly mounted to a substrate (e.g., a PCB). To provide adequate heat dissipation, such substrates may incorporate localized bar vias, conductive tub vias, and/or embedded metal slugs as heat dissipation structures. At the system level, because these heat dissipation structures are localized, and often the structures used to mount the heat-generating components to the substrate do not themselves provide efficient heat dissipation, heat may not be effectively dissipated out of the heat-generating components and through the substrate of an amplifier system. To improve the power capability of such components, component mounting approaches that provide improved heat dissipation (both through the substrate and laterally away from the heat-generating components) may be utilized to improve the performance of an RF amplifier system.

According to various embodiments of the present RF amplifier, thermal dissipation from the heat-generating components of the amplifier may be improved by mounting a substrate containing heat-generating components of the amplifier (e.g., the components of a carrier and/or peaking amplification path in a Doherty amplifier) to a surface-mount component, such as a leadframe package, which may then itself be mounted over complimentary heat dissipation structures implemented with the system's substrate. In some cases, within a particular leadframe package, the heat dissipating amplifier die and/or other heat-generating structures or components may be mounted directly upon the central body of the leadframe package in the module for better thermal performance.

In a Doherty amplifier design, the carrier amplifier and the peaking amplifier each may be implemented using a single-stage or multiple-stage power amplifier comprised of one or more transistor integrated circuit (IC) dies. A single-stage power amplifier includes a single power transistor, and a multiple-stage power amplifier includes, at least, a driver transistor in series with a final-stage transistor. As used herein, when a power amplifier (e.g., the carrier or peaking amplifier) is a single-stage power amplifier, the single transistor stage may be considered a "final-stage" transistor. Using nomenclature typically applied to field effect transistors (FETs), on the input side, the carrier amplifier and the peaking amplifier each may include a transistor (e.g., a driver transistor and/or final-stage transistor) with an input/control terminal (e.g., a gate) configured to receive an RF input signal, and on the output side, the carrier amplifier and the peaking amplifier each may include a final-stage transistor with two current conducting terminals (e.g., a drain terminal and a source terminal). In some configurations, each source terminal is coupled to a ground reference voltage node, and the amplified carrier and peaking signals are provided at the drain terminals (or outputs) of the final-stage carrier amplifier transistor and the final-stage peaking amplifier transistor, respectively.

It should be noted that, whereas the attached Figures and the below description focus on embodiments of electrical devices that includes RF amplifiers having a Doherty architecture, the present invention may be utilized in conjunction with amplifier modules in which the amplifier modules comprise amplification circuitry that is not in a Doherty amplifier configuration. Furthermore, it should be understood that the present invention may be utilized to enable improved thermal management for heat-generating components in non-amplifier electronic modules. For example, as described herein, in various implementations, non-amplifier electronic circuit modules or components that include heat-generating components can be incorporated into the packaged surface mount devices (e.g., surface mount package 410, FIGS. 4, 5, surface mount device 910, FIGS. 9 and 10, described below) in the manner disclosed herein (e.g., in conjunction with heat-generating dies 210, 211, 280, 281 and dies 610, 611, 680, 681) in various embodiments. As such, this disclosure is not limited to approaches for thermal management in Doherty-configured amplifiers and is applicable to thermal management for heat-generating die or components in other types of amplifiers and non-amplifier circuit modules.

FIG. 1 is a schematic diagram of a Doherty amplifier 100, in accordance with an example embodiment. Doherty amplifier 100 is formed over substrate 110, which may include a PCB or another suitable device substrate. As such, some or all components of Doherty amplifier 100 may be implemented within a single amplifier module (e.g., some or all components are coupled to a single amplifier module substrate 110). Doherty amplifier 100 includes an RF input node 112, an RF output node 114, a power or signal splitter 120, a carrier amplifier path 130, a peaking amplifier path 150, an impedance inverter line 176, and a combining node 180, in an embodiment.

When incorporated into a larger RF system, the RF input node 112 is coupled to an RF signal source (not illustrated), and the RF output node 114 is coupled to a load 190 (e.g., an antenna or other load). The RF signal source provides an RF input signal, which is an analog signal that includes spectral energy that typically is centered around one or more carrier frequencies. Fundamentally, the Doherty amplifier 100 is configured to amplify the RF input signal, and to produce an amplified RF signal at the RF output node 114.

The power splitter 120 has an input 122 and two outputs 124, 126, in an embodiment. The power splitter input 122 is coupled to the RF input node 112 to receive the RF input signal. The power splitter 120 is configured to divide the RF input signal received at input 122 into first and second RF signals (or carrier and peaking signals), which are provided to the carrier and peaking amplifier paths 130, 150 through outputs 124, 126, respectively. According to an embodiment, the power splitter 120 includes a first phase shift element, which is configured to impart one or more phase shifts to the first and second RF signals to establish a phase difference between the signals at the outputs 124, 126 (e.g., about a 90 degree phase difference). In a non-inverting Doherty amplifier, the phase shift(s) are applied so that the phase of the RF signal provided to the peaking amplifier lags the phase of the RF signal provided to the carrier amplifier by about 90 degrees. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the RF input signal received at the input 122 into two signals that have substantially equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power. For example, in one embodiment, the peaking amplifier transistor may be about twice the size of the carrier amplifier transistor, and the power splitter 120 may provide a peaking signal with about twice the power as a carrier signal. In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The outputs 124, 126 of the power splitter 120 are connected to the carrier and peaking amplifier paths 130, 150, respectively. The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive substantially in phase with each other at the power combining node 180.

According to an embodiment, the carrier amplifier path 130 includes an input circuit 170 (e.g., including an impedance matching circuit), a carrier amplifier device 132, and the impedance inverter line 176. The peaking amplifier path 150 includes an input circuit 171 (e.g., including an impedance matching circuit), and a peaking amplifier device 152. The carrier and peaking amplifier devices 132, 152 correspond to the carrier and peaking amplifiers, respectively, of the Doherty amplifier 100, and the carrier and peaking amplifiers are implemented using packaged carrier and peaking amplifier devices 132, 152, respectively. According to an embodiment, and as will be described in more detail later, a module housing the Doherty amplifier 100 of FIG. 1 may be packaged as a surface-mount device, such as rectangular, no-leads packaged devices (e.g., Quad Flat No-Lead (QFN) packaged devices) or other types of surface-mount devices. As such, a module substrate of amplifier 100 and, in an embodiment, individual components of amplifier 100 may be mounted directly to a thermal pad or flange of the surface-mount device, as described herein.

In an embodiment, the carrier amplifier device 132 includes an RF input lead 134, an RF input terminal 135 electrically connected to the RF input lead 134, an RF output terminal 138, an RF output lead 164 electrically connected to the RF output terminal 138, and one or more amplification stages 136, 137 coupled between the input and output terminals 135, 138, in various embodiments. The RF input lead 134 is coupled through input circuit 170 to the first output 124 of the power splitter 120, and thus the RF input lead 134 receives the carrier signal produced by the power splitter 120. One or more bias voltage terminals (e.g., drain bias voltage lead 116) may be coupled to one or more external bias circuits (e.g., through terminal 117) for providing DC bias voltages to the amplification stages 136, 137.

Each amplification stage 136, 137 of the carrier amplifier device 132 includes a power transistor. More specifically, each power transistor includes a control terminal (e.g., a gate terminal) and first and second current-carrying terminals (e.g., a drain terminal and a source terminal). In a single-stage device, which would include a single power transistor (e.g., stage 137 but not stage 136), the control terminal of the single power transistor corresponds to the RF input terminal 135, which is electrically connected to the RF input lead 134. One of the current-carrying terminals (e.g., the drain terminal or the source terminal) corresponds to the RF output terminal 138, which is electrically connected to the RF output lead 164. The other current-carrying terminal (e.g., the source terminal or the drain terminal) is electrically connected to a ground reference (e.g., the package flange to which amplifier 100 is coupled). Conversely, a two-stage device would include two power transistors (e.g., both stages 136, 137) coupled in series, where a first transistor functions as a driver amplifier transistor that has a relatively low gain, and a second transistor functions as an output stage (or final stage) amplifier transistor that has a relatively high gain. In such an embodiment, the control terminal of the driver amplifier transistor corresponds to the RF input terminal 135, which is electrically connected to the RF input lead 134. One of the current-carrying terminals of the driver amplifier transistor (e.g., the drain terminal or the source terminal) is electrically connected to the control terminal of the final-stage amplifier transistor, and the other current-carrying terminal of the driver amplifier transistor (e.g., the source terminal or the drain terminal) is electrically connected to the ground reference. Additionally, one of the current-carrying terminals of the final-stage amplifier transistor (e.g., the drain terminal or the source terminal) corresponds to the RF output terminal 138, which is electrically connected to the RF output lead 164. The other current-carrying terminal of the final-stage amplifier transistor (e.g., the source terminal or the drain terminal) is electrically connected to the ground reference.

Each of the transistors 136, 137, 156, 157 may be a field effect transistor (FET) (such as a metal oxide semiconductor FET (MOSFET), a laterally diffused MOSFET (LDMOS FET), a high electron mobility transistor (HEMT), or another type of transistor suitable for the amplification of RF signals. In some embodiments, the semiconductor technology used for the power transistors 136, 137, 156, 157 may include silicon (e.g., the transistors 136, 137, 156, 157 may be silicon LDMOS FETs built on a silicon, silicon carbide, or other silicon-including substrate), while in other embodiments, the semiconductor technology used for the power transistors may include gallium nitride (GaN) (e.g., the transistors 136, 137, 156, 157 may be GaN FETs formed from GaN-including layers built on a silicon, GaN or other substrate).

In addition to the power transistor(s), portions of input and output impedance matching networks and bias circuitry (not illustrated in FIG. 1) also may be included as portions of the carrier amplifier device 132 and/or electrically coupled to the carrier amplifier device 132. Further, in an embodiment in which the carrier amplifier device 132 is a two-stage device, an interstage matching network (not illustrated in FIG. 1) also may be included as a portion of the carrier amplifier device 132.

Reference is now made to the peaking amplifier path 150, which includes an input circuit 171 (e.g., including an impedance matching circuit) and a peaking amplifier device 152, in an embodiment. The peaking amplifier device 152 includes an RF input lead 154, a first RF input terminal 155 electrically connected to the RF input lead 154, an RF output terminal 158, an RF output lead 160 electrically connected to the RF output terminal 158, a second RF input lead 166 electrically connected to the RF output terminal 158, and one or more amplification stages 156, 157 coupled between the input and output terminals 155, 158, in various embodiments. The RF input lead 154 is coupled through input circuit 171 to the second output 126 of the power splitter 120, and thus the RF input lead 154 receives the peaking signal produced by the power splitter 120. One or more bias voltage terminals (e.g., drain bias voltage lead 119) may be coupled to one or more external bias circuits (e.g., through terminal 118) for providing DC bias voltages to the amplification stages 156, 157.

As with the carrier amplifier device 132, each amplification stage 156, 157 of the peaking amplifier device 152 includes a power transistor. More specifically, each power transistor includes a control terminal (e.g., a gate terminal) and first and second current-carrying terminals (e.g., a drain terminal and a source terminal). In a single-stage device, which would include a single power transistor (e.g., stage 157 but not stage 156), the control terminal of the single power transistor corresponds to the RF input terminal 155, which is electrically connected to the RF input lead 154. One of the current-carrying terminals (e.g., the drain terminal or the source terminal) corresponds to the RF output terminal 158, which is electrically connected to the RF output lead 160. The other current-carrying terminal (e.g., the source terminal or the drain terminal) is electrically connected to a ground reference (e.g., the package flange to which amplifier device 100 is coupled). Conversely, a two-stage device would include two power transistors (e.g., both stages 156, 157) coupled in series, where a first transistor functions as a driver amplifier transistor that has a relatively low gain, and a second transistor functions as an output stage (or final stage) amplifier transistor that has a relatively high gain. In such an embodiment, the control terminal of the driver amplifier transistor corresponds to the RF input terminal 155, which is electrically connected to the RF input lead 154. One of the current-carrying terminals of the driver amplifier transistor (e.g., the drain terminal or the source terminal) is electrically connected to the control terminal of the final-stage amplifier transistor, and the other current-carrying terminal of the driver amplifier transistor (e.g., the source terminal or the drain terminal) is electrically connected to the ground reference. Additionally, one of the current-carrying terminals of the final-stage amplifier transistor (e.g., the drain terminal or the source terminal) corresponds to the RF output terminal 158, which is electrically connected to RF output lead 160. The other current-carrying terminal of the final-stage amplifier transistor (e.g., the source terminal or the drain terminal) is electrically connected to the ground reference.

In addition to the power transistor(s), portions of input and output impedance matching networks and bias circuitry (not illustrated in FIG. 1) also may be included as portions of the peaking amplifier device 152 and/or electrically coupled to the peaking amplifier device 152. Further, in an embodiment in which the peaking amplifier device 152 is a two-stage device, an interstage matching network (not illustrated in FIG. 1) also may be included as a portion of the peaking amplifier device 152.

The RF output terminal 158 of the peaking amplifier device 152 is coupled to the power combining node 180 and to impedance inverter line 176. According to an embodiment, the RF output terminal 158 of the peaking amplifier device 152 and the combining node 180 are implemented with a common element. More specifically, in an embodiment, the RF output terminal 158 of the peaking amplifier device 152 is configured to function both as the combining node 180 and as the output terminal 158 of the peaking amplifier device 152.

The RF output terminals 138, 158 of the carrier and peaking amplifier devices 132, 152 are coupled together through impedance inverter line 176. Or, said another way, the RF output terminal of the carrier amplifier device 132 is electrically coupled to the combining node 180 through impedance inverter line 176, and the RF output terminal of the peaking amplifier device 152 is directly coupled to the combining node 180.

According to an embodiment, impedance inverter line 176 is a phase shift circuit, which imparts about a 90 degree relative phase shift at the fundamental frequency of operation, $f_0$, to the carrier signal after amplification by the carrier amplifier device 132. A first or "proximal" end of transmission line 176 is coupled to the RF output terminal 138 of the carrier amplifier device 132, and a second or "distal" end of transmission line 176 is coupled to the power combining node 180.

The amplifier 100 is designed so that, during operation, the amplified carrier and peaking RF signals combine substantially in phase (or coherently) at the combining node 180. The combining node 180 is electrically coupled through RF output lead 160 and output impedance matching network 184 to the RF output node 114. Accordingly, the amplified and combined RF output signal is provided through lead 160 and network 184 to the RF output node 114. In an embodiment, the output impedance matching network 184 between the combining node 180 and the RF output node 114 functions to present proper load impedances to each of the carrier and peaking amplifier devices 132, 152. The resulting amplified RF output signal is produced at RF output node 114, to which an output load 190 (e.g., an antenna) may be connected.

Amplifier 100 is configured so that the carrier amplifier path 130 provides amplification for relatively low level input signals, and both amplifier paths 130, 150 operate in combination to provide amplification for relatively high level input signals. This may be accomplished, for example, by biasing the carrier amplifier device 132 so that the carrier amplifier device 132 operates in a class AB mode, and biasing the peaking amplifier device 152 so that the peaking amplifier device 152 operates in a class C mode.

According to an embodiment, the carrier and peaking amplifier devices 132, 152 are oriented, with respect to each other, so that corresponding portions of the carrier and peaking amplifier paths 130, 150 extend in directions that are substantially different from each other. As used herein, the term "signal path" refers to the path followed by an RF signal through a circuit. For example, a portion of a first signal path through the carrier amplifier device 132 extends in a first direction (indicated by arrow 130) between the RF input and output terminals 135, 138. Similarly, a portion of a second signal path through the peaking amplifier device 152 extends in a second direction (indicated by arrow 150) between the RF input and output terminals 155, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. In still other embodiments, the first and second directions may be parallel (e.g., the carrier and peaking amplifier devices 132, 152 may be oriented in the same direction).

Figure 2:
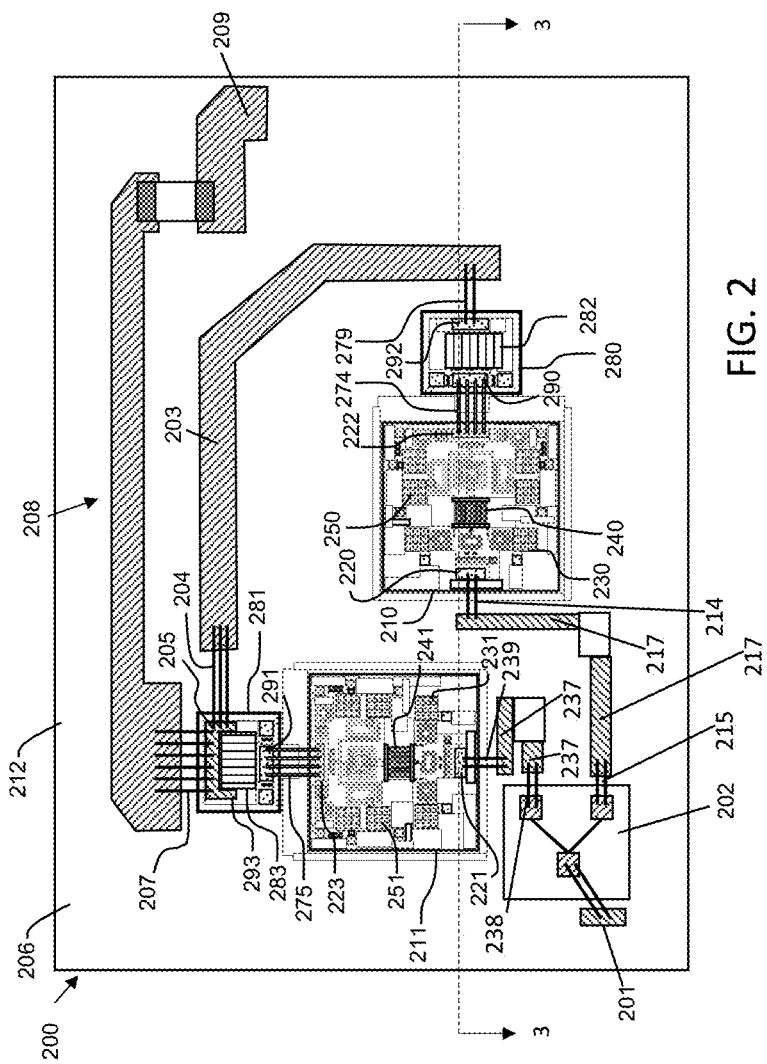
FIG. 2 is a top view of an RF amplifier device module.
Figure 3:
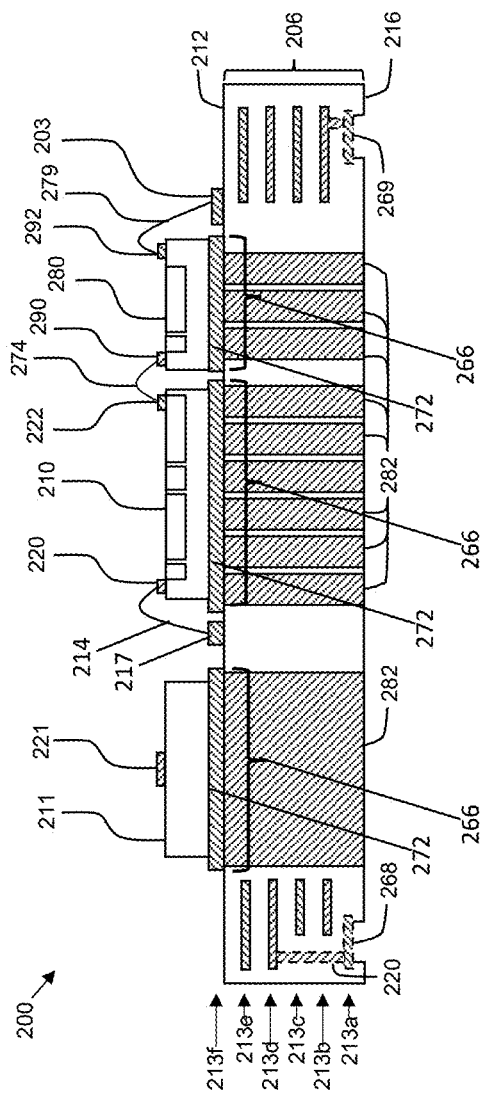
FIG. 3 is a cross-sectional, side view of the RF amplifier device of FIG. 2 taken along line 3-3 of FIG. 2.

FIG. 2 is a top view of an example of an RF amplifier module 200 (e.g., a module embodying the amplifier 100 of FIG. 1), and FIG. 3 is a cross-sectional, side view of the RF amplifier module 200 along line 3-3 of FIG. 2. RF amplifier module 200 includes a Doherty amplifier, in an embodiment, though in other embodiments, module 200 could include other types of amplifier and electrical circuits. Because, in the depicted embodiment, module 200 is self-contained and includes a Doherty amplifier, RF amplifier module 200 may alternatively be referred to below as a "Doherty power amplifier module."

According to an embodiment, the Doherty amplifier module 200 is implemented as a module with terminals exposed at a bottom surface, such as, for example a land grid array (LGA) module. More specifically, the Doherty power amplifier module 200 includes a substrate 206, which may include a multiple-layer printed circuit board (PCB) with a component mounting surface 212 and an opposed land surface 216. The substrate 206 includes a plurality of dielectric material layers (e.g., formed from FR-4, ceramic, or other PCB dielectric materials), and a plurality of conductive (e.g., metal) layers 213a-213f, which are separated by the dielectric material of the dielectric material layers. In an embodiment, the conductive layer 213f on the component mounting surface 212 of the substrate 206 is a patterned conductive layer. Various conductive features (e.g., conductive die pads 272 and traces) formed from portions of the top patterned conductive layer may serve as attachment points for dies 210, 211, 280, 281 and other discrete components, and also may provide electrical connectivity between the dies 210, 211, 280, 281 and the other discrete components. Another conductive layer may serve as a ground reference plane. In some embodiments, the additional patterned conductive layers may provide conductive connections between the dies 210, 211, 280, 281, the discrete components, and the ground reference plane. According to an embodiment, a bottom conductive layer 213a is utilized to provide backside externally accessible conductive landing pads 268, 269 that may be used to electrically and mechanically couple module 200 and components thereof to external components, for example. In the depicted embodiment, landing pad 268 may be electrically connected (e.g., via one or more of, metal layers 213a-213f and conductive vias) to input terminal 201 at the mounting surface 212. Similarly, landing pad 269 may be electrically connected to output terminal 209 at the mounting surface 212. These various landing pads (among others, not illustrated) enable surface mounting of the Doherty power amplifier module 200 onto a separate substrate (e.g., lower package body 412, FIG. 4) that provides electrical connectivity to other portions of an RF system.

Doherty power amplifier module 200 further includes RF signal input terminal 201, RF signal output terminal 209, a power splitter 202, a main amplifier path that includes a cascade-coupled driver stage die 210 and final stage die 280, a peaking amplifier path that includes a cascade-coupled driver stage die 211 and final stage die 281, various phase shift and impedance matching elements, and a combiner.

Each of the components of amplifier module 200 and, specifically, carrier and peaking amplifier dies 210, 211, 280, 281 may produce significant amounts of heat during operation. In addition, each of the carrier and peaking amplifier dies 210, 211, 280, 281 may also need access to a ground reference. Accordingly, in an embodiment, substrate 206 also includes a plurality of electrically and thermally conductive trenches 282 to which the carrier and peaking amplifier dies 210, 211, 280, 281 are coupled via a thermally conductive material (e.g., with solder, brazing material, sinter, or other die attach materials) so that the dies 210, 211, 280, 281 are thermally and electrically coupled to the thermally conductive trenches 282. The trenches 282 extend through the substrate 206 thickness in die mounting zones 266 of substrate 206 to provide heat sinks and ground reference access to the carrier and peaking amplifier dies 210, 211, 280, 281. For example, the conductive trenches 282 may be filled with copper or another thermally and electrically conductive material. In alternate embodiments, the trenches 282 may be replaced with other types of heat-conveying structures, such as conductive slugs (e.g., copper slugs) or thermal vias.

The power splitter 202, which is coupled to the mounting surface 212 of the substrate 206 and comprises an input circuit of module 200, may include one or more discrete die and/or components, although it is represented in FIG. 2 as a single element. The input circuit of module 200 may more generally be considered 'circuitry' or 'amplifier circuitry' that is coupled to the mounting surface 212 of the substrate 206. The power splitter 202 includes an input terminal and two output terminals. The input terminal of the power splitter 202 is electrically coupled through one or more conductive structures (e.g., vias, traces, and/or wirebonds) to the input terminal 201 to receive an input RF signal. The output terminals of the power splitter 202 are electrically coupled through one or more conductive structures (e.g., vias, traces 217, 237, and/or wirebonds 215, 214, 238, 239) to input terminals 220, 221 for the main and peaking amplifiers, respectively.

In the depicted Doherty amplifier configuration, the power splitter 202 is configured to split the power of the input RF signal received through the input terminal 201 into first and second RF signals, which are produced at the output terminals of the power splitter 202. In addition, the power splitter 202 may include one or more phase shift elements configured to impart about a 90 degree phase difference between the RF signals provided at the output terminals of the power splitter 202. The first and second RF signals produced at the outputs of the power splitter 202 may have equal or unequal power.

The first output of the power splitter is electrically coupled to the main amplifier path (i.e., to the main amplifier), and the second output of the power splitter is electrically coupled to the peaking amplifier path (i.e., to the peaking amplifier). In the illustrated embodiment, the RF signal produced at the second power splitter output is delayed by about 90 degrees from the RF signal produced at the first power splitter output. In other words, the RF signal provided to the peaking amplifier path is delayed by about 90 degrees from the RF signal provided to the main amplifier path.

The first RF signal produced by the power splitter 202 is amplified through the main amplifier path, which includes the driver stage die 210, the final stage die 280, and impedance inverter element 203 that includes an impedance inverter and phase shifter. The second RF signal produced by the power splitter 202 is amplified through the peaking amplifier path, which includes the driver stage die 211, the final stage die 281.

The first output of the power divider 202 is electrically coupled to an input terminal 220 of the driver stage die 210 (corresponding to a main amplifier input) through various conductive traces, circuitry, and wirebonds or other types of electrical connections. The driver stage die 210 and the final stage die 280 of the main amplifier path are electrically coupled together in a cascade arrangement between the input terminal 220 of the driver stage die 210 and an output terminal 292 of the final stage die 280 (corresponding to a main amplifier output). The driver stage die 210 includes the input terminal 220, an output terminal 222, an input impedance matching circuit 230, a power transistor 240, and an integrated portion of an interstage impedance matching circuit 250, in an embodiment.

The final stage die 280 includes an input terminal 290, an output terminal 292, and a power transistor 285. The output terminal 222 of the driver stage die 210 is electrically coupled to the input terminal 290 of the final stage die 280 through a wirebond array 274 or another type of electrical connection. The input terminal 290 is electrically coupled to the gate of the power transistor 285.

An amplified first RF signal is produced at the output terminal 292 of the final stage die 280. According to an embodiment, the output terminal 292 is electrically coupled (e.g., through wirebonds 279 or another type of electrical connection) to impedance inverter element 203. According to an embodiment, impedance inverter element 203 has a first end that is proximate to the output terminal 292 of the final stage die 280, and a second end that is proximate to the output terminal 293 of the final stage die 281. For example, the impedance inverter element 203 may be implemented with an approximately lambda/4 ($\lambda$/4) transmission line (e.g., a microstrip transmission line with a 90 degree electrical length) that extends between its first and second ends. The impedance inverter element 203, along with the wirebonds 279, 204, may impart about a 90 degree relative phase shift to the amplified first RF signal as the signal travels from the phase shift element's first end to a combining node 205 coupled to its second end.

As mentioned above, the second RF signal produced by the power splitter 202 is amplified through the peaking amplifier path, which includes the driver stage die 211 and the final stage die 281. Accordingly, the second output of the power divider 202 is electrically coupled to an input terminal 221 of the driver stage die 211 through various conductive traces, circuitry, and wirebonds or another type of electrical connection.

The driver stage die 211 and the final stage die 281 of the peaking amplifier path are electrically coupled together in a cascade arrangement between an input terminal 221 of the driver stage die 211 (corresponding to a peaking amplifier input) and an output terminal 293 of the final stage die 281 (corresponding to a peaking amplifier output). The driver stage die 211 includes a plurality of integrated circuits. In an embodiment, the integrated circuitry of die 211 includes the input terminal 221, an output terminal 223, an input impedance matching circuit 231, a power transistor 241, and an integrated portion of an interstage impedance matching circuit 251, in an embodiment.

The final stage die 281 includes a plurality of integrated circuits. In an embodiment, the integrated circuitry of die 281 includes an input terminal 291, an output terminal 293, and a power transistor 283.

The output terminal 223 of the driver stage die 211 is electrically coupled to the input terminal 291 of the final stage die 281 through a wirebond array 275 or another type of electrical connection. The input terminal 291 is electrically coupled to the gate of the power transistor 283.

The signal path through the cascade-coupled peaking amplifier dies 211, 281 is in a direction extending from the RF input terminal 221 to the RF output terminal 293. Conversely, the signal path through the cascade-coupled main amplifier dies 210, 280 is in a direction extending from the driver stage die input terminal 220 to the final stage die output terminal 292. As can be seen in FIG. 2, the signal paths through the cascade-coupled peaking amplifier dies 211, 281 and the cascade-coupled main amplifier dies 210, 280 extend in significantly different directions, and more particularly the signal paths are orthogonal in the embodiment of FIG. 2.

In any event, the amplified second RF signal is produced by the final stage die 281 at the RF output terminal 293. According to an embodiment, the RF output terminal 293 is electrically coupled (e.g., through wirebonds 204 or another type of electrical connection) to the second end of the impedance inverter element 203. Accordingly, the amplified first RF signal produced by the final stage die 280 is conveyed to the RF output terminal 293, and the output terminal 293 functions as a summing node 205 for the amplified first and second RF signals. When the various phase shifts imparted separately on the first and second RF signals are substantially equal, the amplified first and second RF signals combine substantially in phase at summing node 205.

The RF output terminal 293 (and thus summing node 205) is electrically coupled (e.g., through wirebonds 207 or another type of electrical connection) to an output network 208, which functions to present the proper load impedances to each of main and peaking amplifier dies 280, 281. In addition, the output network 208 may include a decoupling capacitor, as shown. Although the detail is not shown in FIG. 2, the output network 208 may include various conductive traces, additional discrete components, and/or integrated components (e.g., capacitors, inductors, and/or resistors) to provide the desired impedance matching. The output network 208 is electrically coupled through the substrate 206 to conductive output terminal 209 exposed at the bottom surface of the substrate 206. The output terminal 209 functions as the RF output node for the Doherty power amplifier module 200 for outputting an amplifier output signal. The output network 208 of module 200 may more generally be considered 'circuitry' or 'amplifier circuitry' that is coupled to the mounting surface 212 of the substrate 206.

Figure 4:
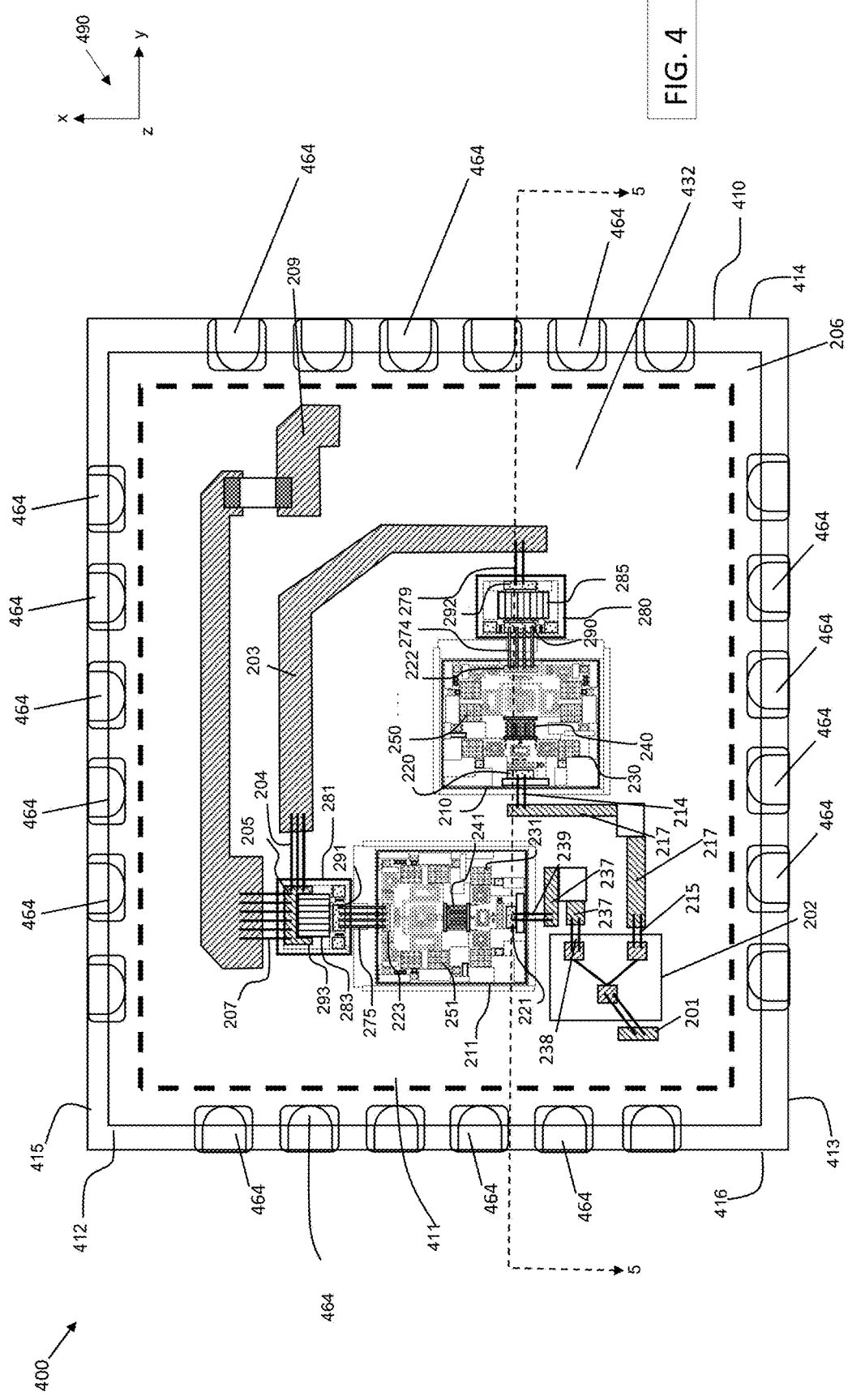
FIG. 4 is a top view of a surface-mount packaged amplifier device, in accordance with an example embodiment.
Figure 5:
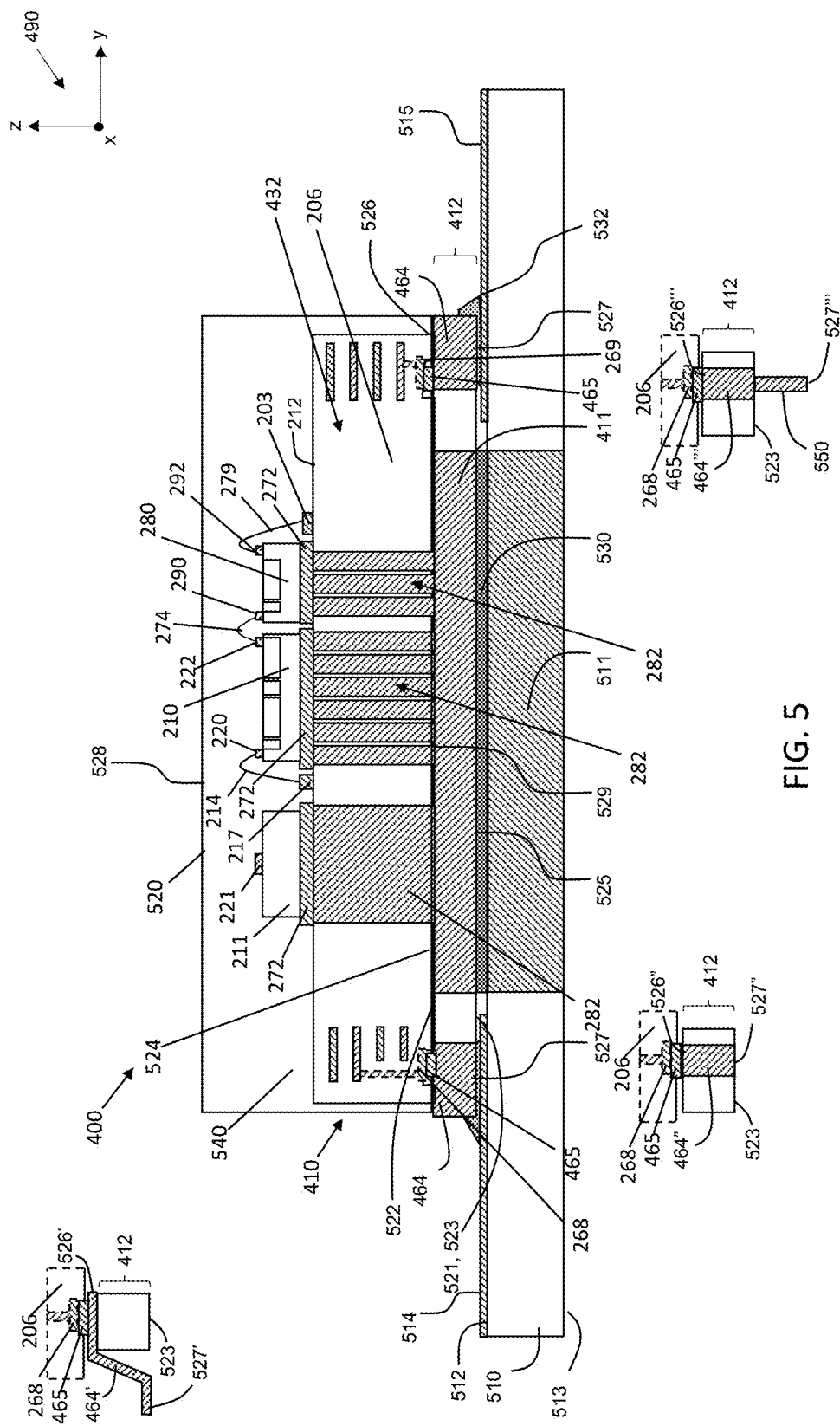
FIG. 5 is a cross-sectional, side view of the surface-mount packaged amplifier device of FIG. 4 taken along line 5-5.

An embodiment of a surface-mount amplifier device module will now be described in detail with reference to FIGS. 4-5. More specifically, FIG. 4 is a top view of a surface-mount packaged amplifier device 400, in accordance with an example embodiment, and FIG. 5 is a cross-sectional, side view of the device 400 of FIG. 4 along line 5-5. To enhance description of the relative orientations and directions of various elements of FIGS. 4-5, each of FIGS. 4-5 include a depiction of a three-dimensional Cartesian coordinate axis system 490, with orthogonal x-, y-, and z-axes depicted.

Amplifier device 400 includes a surface-mount package 410 in which RF amplifier module 432 (e.g., module 200, FIGS. 2, 3) is installed. RF amplifier module 432 has a similar configuration to the amplifier module 200 of FIGS. 2 and 3. Components within amplifier module 432 having the same element numbers as components within amplifier module 200 share the same configuration and corresponding description.

In the depicted embodiment, the surface-mount package 410 has a rectangular (e.g., square) perimeter defined by first, second, third, and fourth sides 413, 414, 415, 416 that extend between a top surface 520 (FIG. 5) and an opposed bottom (or substrate-facing) surface 521. The surface-mount package 410 includes a leadframe with a central thermal pad or flange 411 and a plurality of leads (e.g., leads 464), which are electrically isolated from each other and held in fixed orientation with respect to each other by a lower package body 412. The lower package body 412 has opposed top and bottom surfaces 522, 523, where the top surface 522 of the lower package body 412 is internal to the package 410, and the bottom surface 523 of the lower package body 412 also corresponds to the bottom surface 521 of the overall package 410. According to an embodiment, the lower package body 412 may be formed from a molded plastic encapsulant material, although in other embodiments, the package body 412 may be formed from ceramic or another high-dielectric material.

The flange 411 is an electrically and thermally conductive, solid structure, which is centrally located in the lower package body 412, and which extends between the top and bottom surfaces 522, 523 of the lower package body 412. More particularly, a top surface 524 of the flange 411 is co-planar with the top surface 522 of the lower package body 412, and a bottom surface 525 of the flange 411 is co-planar with the bottom surface 523 of the lower package body 412 (and with the bottom surface 521 of the package 410). The flange 411 may be formed, for example, from bulk thermally and electrically conductive material (e.g., copper), which may or may not be plated. Alternatively, the flange 411 may be formed from a composite (e.g., layered or multi-part) thermally conductive structure.

As will be discussed in more detail later, a portion of the bottom surface 529 of the amplifier module 432 is physically, thermally, and, optionally, electrically connected (e.g., with a solder connection, thermally and/or electrically conductive adhesive, brazing, sintering, or other materials) to the top surface 524 of the flange 411, and the bottom surface 525 of the flange 411 is physically, thermally, and, optionally, electrically connected (e.g., with solder connection 530, thermally and/or electrically conductive adhesive, or other materials) to the top surface 512 of a system substrate 510 (as shown in FIG. 5). System substrate 510 may further include a flange 511 (e.g., a system substrate thermally conductive flange) that extends between the top and bottom surfaces 512, 513 of the substrate 510. When thermally coupled to flange 411, flange 511 can operate as a heat sink to extract heat energy out of flange 411 and out of package 410.

Sets of leads 464 are located at or proximate to each of the four sides 413-416 of the lower package body 412. Specifically, in FIG. 4, six aligned leads 464 are located at each of the four sides 413-416 of the lower package body 412. Alternatively, more or fewer leads 464 may be located at or proximate to each of the four sides 413-416. Sometimes alternatively referred to as "lands" or "pins", each of the leads 464 also are formed from bulk electrically conductive material (e.g., copper), which may or may not be plated. Alternatively, the leads 464 may be formed from a composite (e.g., layered or multi-part) conductive structure. Essentially, each lead 464 is a roughly cubic structure with a top surface 526 (or an "internal end" or "proximal end") that is exposed at and/or co-planar with the top surface 522 of the lower package body 412, a bottom surface 527 (or an "external end" or "distal end") that is co-planar with the bottom surface 523 of the lower package body 412 (and the bottom surface 521 of the device 400), and four side surfaces extending between the top and bottom surfaces 526, 527. The internal end (e.g., the top surface 526) of each lead 464 is at a height above the bottom surface 521 of the device (and thus is at a height above the top surface 512 of the system substrate 510). According to an embodiment, this height, which essentially corresponds to the thickness of the leads 464 (i.e., the distance between the top and bottom surfaces 526, 527 of each lead), is in a range of about 0.2 millimeters (mm) to about 0.5 mm, in an embodiment, or from about 0.3 mm to about 0.4 mm, in a more specific embodiment. The bottom surface 527 of each lead is exposed at the bottom surface 523 of the lower package body 412 (and at the bottom surface 521 of the device 400), and one of the side surfaces of each lead 464 may be exposed at a side 413-416 of the lower package body 412. In other embodiments, a side surface of a lead may not be exposed at a side 413-416 of the lower package body 412 (e.g., encapsulant material of the lower package body 412 may be present between the lead 464 and the sides 413-416 of the lower package body 412). Either way, the lead configuration ultimately facilitates robust connections (e.g., solder connections 532 or connections to a socket) of the leads to conductive structures (e.g., traces 514, 515) at the top surface 512 of the system substrate 510. Considering the planes of the top surfaces 520, 528, 512 of the device package 410, the amplifier module 432, and the system substrate 510 to be "horizontal", each of the leads 464 may be considered to be a "vertical" conductor.

Although leads 464 are described to be roughly cubic structures that form portions of a leadframe, each lead 464 alternatively may have more or fewer than four sides, or may have shapes that are other than cubic. For example, in an alternate embodiment, the amplifier module 432 may be packaged in a Quad Flat Package (QFP). Essentially, a QFP differs from a QFN package in that the QFP includes gull wing leads (e.g., the gull wing lead 464' shown in the top left corner of FIG. 5, rather than bulk conductive leads 464 of a leadframe), which provide for electrical coupling between the amplifier module 432 and the system substrate 510. As with a QFN package, a QFP package includes a thermal pad or flange (e.g., flange 411, FIG. 4), a plurality of leads (in this case, gull wing leads, such as the gull wing lead 464' shown in the top left corner of FIG. 5), and a package body that holds the flange and the leads in a fixed orientation with respect to each other. Each gull wing lead 464' includes an internal end 526' (analogous to the top surface 526 or internal or proximal end of leads 464), which can be embedded in and coplanar with the top surface 524 of the package body 412, and an external end 527' (analogous to the bottom surface 527 or external or distal end of leads 464), which is external to the lower package body 412 and co-planar with the bottom surface 523 of the lower package body 412. As will be explained in more detail below, in a QFP embodiment with gull wing leads, a distal end of a wirebond is connected to the elevated internal end 526' of each gull wing lead 464', and the external distal end 527' of the gull wing lead 464' is connected to a conductive structure (e.g., one of traces 514, 515 or other conductive structures) at the top surface 512 of the amplifier module substrate 510.

In still another alternate embodiment, the lower package body 412 may include a Land Grid Array (LGA), a Pin Grid Array (PGA) or a Ball Grid Array (BGA) that includes an array of lands, balls, or pins at the bottom surface 523 of the lower package body 412. Two embodiments of LGA and PGA leads 464", 464''' are shown at the lower left and lower right corners of FIG. 5, respectively. LGA lead 464" is inset from the side of the lower package body 412, and extends between a top or proximal end 526" at the top surface 522 of the lower package body 412, and a bottom or distal end 527" at the bottom surface of the lower package body 412. The bottom end 527" functions as a land, that may be solder attached to a corresponding contact on the top surface of a PCB, or that may be contacted by a conductive pin protruding from the PCB. In some embodiments, such a conductive pin may protrude into the lead 464" (i.e., each lead 464" actually functions as a single-pin socket).

PGA lead 464''' also is inset from the side of the lower package body 412, and has a portion that extends between a top or proximal end 526'''' at the top surface 522 of the lower package body 412 and the bottom surface 523 of the lower package body 412. However, PGA lead 464''' also includes a pin 550 that protrudes from the bottom surface 523 of the lower package body 412, and an end 527''' of the pin 550 corresponds to the bottom or distal end of the lead 464'''. The pin 550 is configured to be received by a socket coupled to a PCB.

The amplifier module 432 includes the amplification circuitry (e.g., amplification stages 136, 137 or 156, 157, FIG. 1) of amplifier module 200. Specifically, a portion of the substrate 206 of amplifier module 432 is physically and electrically connected to the top surface 524 of the flange 411 (e.g., using solder, thermally and/or electrically conductive adhesive, brazing, sintering, or other materials).

In addition to the trenches 282 (or alternate structures) of the package 410 being connected to the flange 411, electrical connections are made via conductive material 465 (e.g., solder) between conductive terminals (e.g., landing pads 268, 269) of amplifier module 432 and certain ones of the leads 464 to electrically connect such leads 464 to components of amplifier module 432. Specifically, landing pads 268, 269 are connected to the top surfaces 526 (or to the internal or proximal ends) of certain ones of the leads 464 by conductive material 465. In other embodiments, as was discussed previously, the surface-mount package may be a QFP, LGA, or BGA package, and landing pads 268, 269 are connected to proximal ends 526', 526", 526''' of the corresponding leads 464', 464", 464''' by conductive material 465.

In an alternative embodiment of package 410, in which the package 410 does not include backside landing pads 268, 269, leads 464 may be electrically connected to components of package 410 via wirebond connections formed between one or more of leads 464 and electrical contact pads or terminals formed on mounting surface 212 of the substrate 206 of package 410. For example, in such an embodiment, input terminal 201 may be connected to a lead 464 by wirebond connection and, similarly, output terminal 209 may be connected to a lead 464 by wirebond connection.

In some embodiments, the amplifier module 432, any wirebonds, the portion of the top surface 522 of the lower package body 412 that is not covered by the module 432, and the top surfaces 526 (or internal or proximal ends) of the leads 464 that are not covered by the module 432 may then be overmolded with encapsulant material 540. Alternatively, a protective cap may be attached to the top surface 522 of the lower package body 412 to establish a sealed, internal air cavity that contains the amplifier module 432. In other words, the surface-mount package 410 also may be an air-cavity QFN package (or another type of surface-mount, air cavity package).

As discussed above, the illustrated embodiment of amplifier module 432 embodies a dual-path RF Doherty amplifier. The amplifier includes signal splitter 202 that is configured to receive an input RF signal via input terminal 201. Input terminal 201 is electrically connected to landing pad 268, which in turn is physically and electrically connected to one of the leads 464 via solder or other conductive material 465. Amplifier module 432 also includes an output terminal 209 at which the amplified signal generated by amplifier package 432 is produced. Output terminal 209 is electrically connected to landing pad 269, which in turn is physically and electrically connected to another one of the leads 464 via solder or other conductive material 465 (or any other suitable electrical interconnection).

In various embodiments, other conductive contacts may be available in amplifier module 432 enabling electrical connections between components of amplifier module 432 and one or more of leads 464.

During operation of surface-mount package 410 and, specifically, amplifier module 432 therein, heat generated by components of amplifier module 432 (and, specifically, driver and final stage dies 210, 211, 280, 281 of amplifier module 432) can be efficiently extracted out of those transistors and the dies in which they are implemented, through heat dissipation structures 282 of amplifier module 432 and central thermal pad or flange 411 of surface-mount package 410, and, ultimately, thermally conductive structures (e.g., flange 511) of a system substrate or circuit board to which surface-mount package 410 is mounted.

Figure 6:
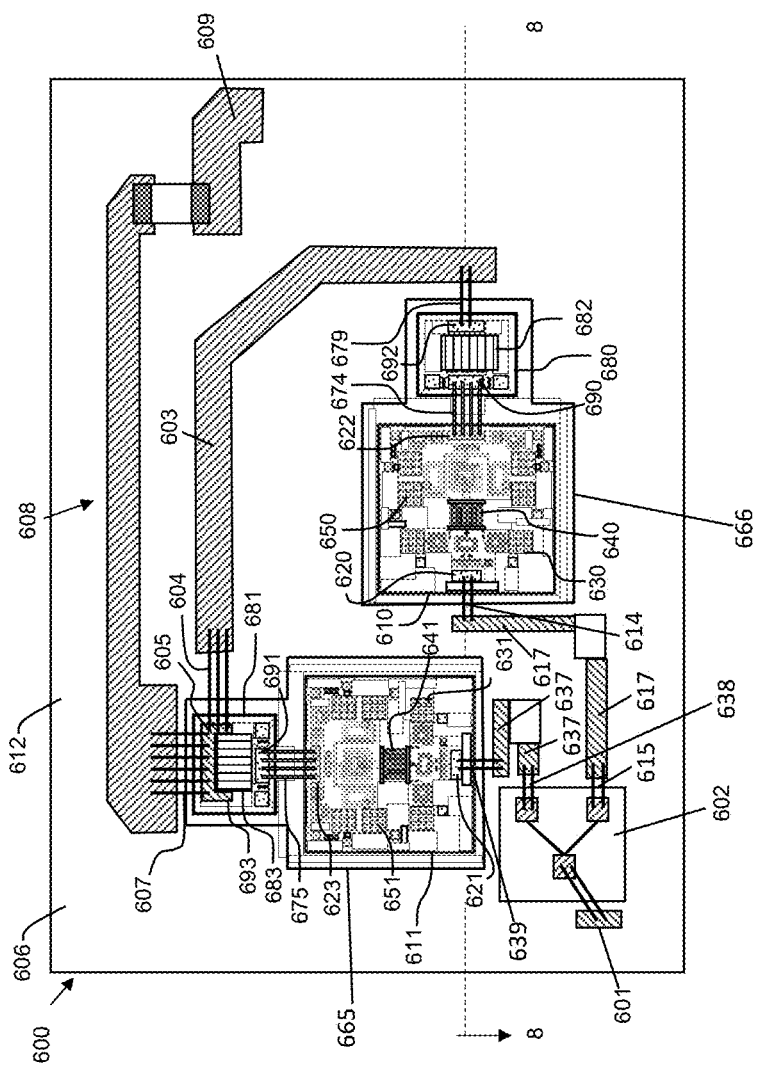
FIG. 6 is a top view of an example of an RF amplifier device, in accordance with an example embodiment.
Figure 8:
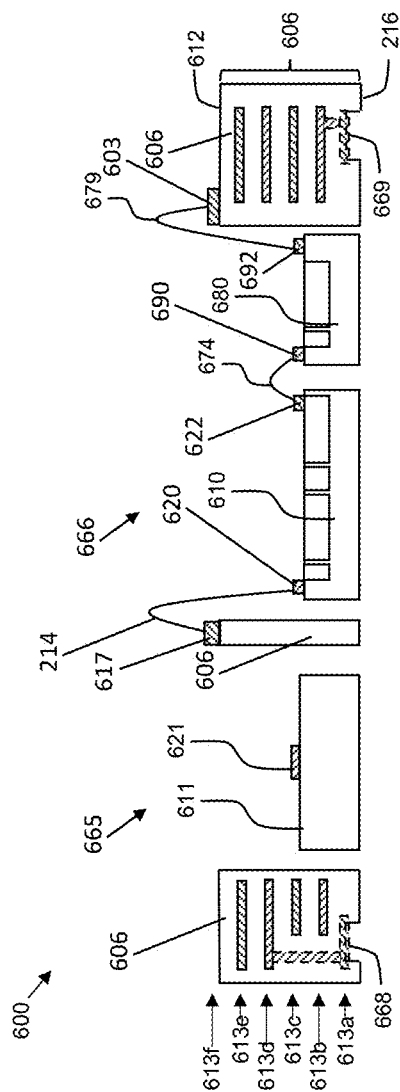
FIG. 8 is a cross-sectional, side view of the RF amplifier device of FIG. 6 taken along line 8-8 of FIG. 2.

In an alternate embodiment of the present device, within a surface mount device, amplifier dies may be coupled directly to a thermally conductive flange of the surface mount device, rather than being coupled through vias 282, for example. This arrangement may provide efficient heat extraction from the amplifier dies. To illustrate, FIG. 6 is a top view of an example of an RF amplifier module 600 (e.g., a module embodying the amplifier 100 of FIG. 1), and FIG. 8 is a cross-sectional, side view of the RF amplifier module 600 along line 8-8 of FIG. 6 in accordance with the present embodiment. RF amplifier module 600 includes a Doherty amplifier, in an embodiment, though in other embodiments, module 600 could include other types of amplifiers and electrical circuits. Because, in the depicted embodiment, module 600 is self-contained and includes a Doherty amplifier, RF amplifier module 600 may alternatively be referred to below as a "Doherty power amplifier module."

The Doherty power amplifier module 600 includes a substrate 606, which in some embodiments may take the form of a multiple-layer PCB or another suitable substrate, with a component mounting surface 612 and an opposed land surface 616. The module substrate 606 may include a plurality of dielectric material layers (e.g., formed from FR-4, ceramic, or other PCB dielectric materials), and a plurality of metal layers 613a-613f, which are separated by the dielectric material of the dielectric material layers. In an embodiment, the conductive layer 613f on the component mounting surface 612 of the module substrate 606 is a patterned conductive layer. Various conductive features (e.g., conductive pads and traces) formed from portions of the top patterned conductive layer may serve as attachment points for various discrete components of amplifier module 600 and also may provide some electrical connectivity between the dies 610, 611, 680, 681 and the other discrete components. Another conductive layer may serve as a ground reference plane for amplifier module 600. In some embodiments, the additional patterned conductive layers may provide some portion of the conductive connections between the dies 610, 611, 680, 681, the discrete components, and the ground reference plane. According to an embodiment, a bottom conductive layer 613a can be utilized to provide backside externally-accessible conductive landing pads 668, 669 that may be used to couple module 600 and components thereof to external components, for example. In the depicted embodiment, for example, landing pad 668 may be electrically connected (e.g., via one or more of, metal layers 613a-613f) to input terminal 601. Similarly, landing pad 669 may be electrically connected to output terminal 609. These various landing pads (among others, not illustrated) enable surface mounting of the Doherty power amplifier module 600 onto a separate substrate (e.g., lower package body 912, FIGS. 9, 10) that provides electrical connectivity to other portions of an RF system.

Doherty power amplifier module 600 further includes an RF signal input terminal 601, an RF signal output terminal 609, a power splitter or signal splitter 602, a main amplifier path that includes a cascade-coupled driver stage die 610 and final stage die 680, a peaking amplifier path that includes a cascade-coupled driver stage die 611 and final stage die 681, various phase shift and impedance matching elements, and a combiner.

Figure 7:
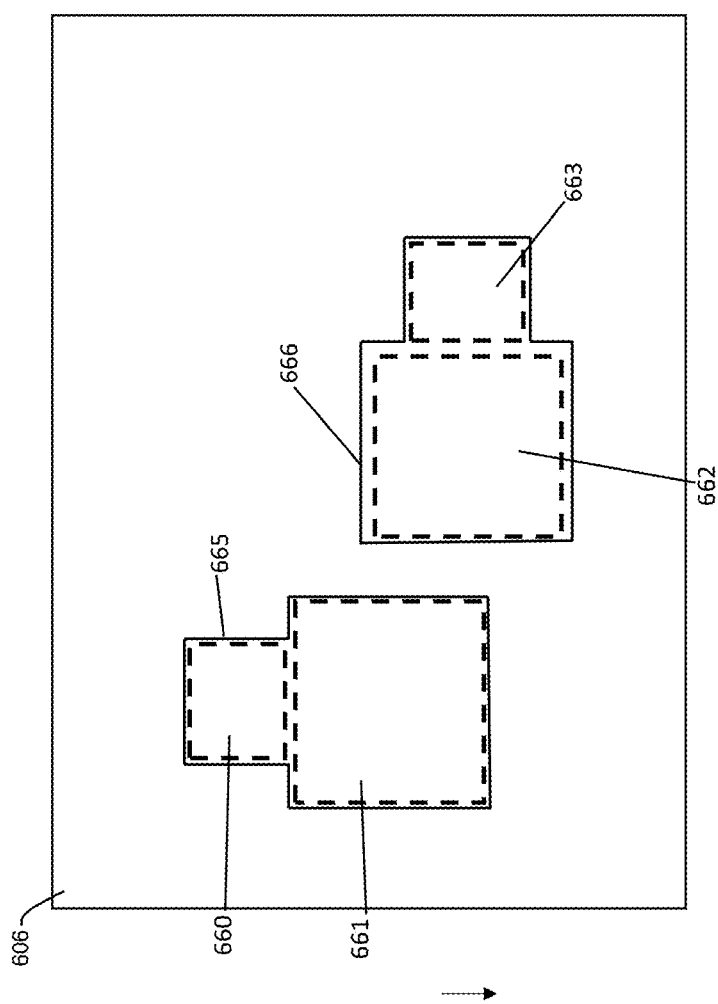
FIG. 7 depicts the substrate of the RF amplifier device of FIG. 6 including die attach windows define therein.

Within amplifier module 600, a number of die mount openings, through-holes, or windows 665, 666 are defined by and present within substrate 606. For clarification, FIG. 7 depicts substrate 606 and windows 665, 666 therein without the other components of amplifier module 600. Each of the windows 665, 666 extends between the component mounting surface 612 and an opposite bottom surface of the module substrate 606, and each of the windows 665, 666 is further defined by sidewalls that define the perimeter of each window 665, 666. As depicted in FIG. 6, within amplifier module 600, windows 665, 666 are sized so that the perimeters of windows 665, 666 approximately match the perimeters of the driver and main amplifier dies 610, 611, 680, 681. Because dies 610, 611, 680, 681 are each positioned within (and may be surrounded by) one of windows 665, 666, dies 610, 611, 680, 681 may not be in direct physical contact with the sidewalls of the windows 665, 666 or the module substrate 606 within module 600.

In typical embodiments, to facilitate fabrication, the perimeters of windows 665, 666 may be slightly larger than the perimeters of their respective dies 610, 611, 680, 681. In typical applications, windows 665, 666 may be sized so that a minimum gap between an inner perimeter of windows 665, 666 (or the window sidewalls) and their respective dies 610, 611, 680, 681 varies from about 125 microns to about 150 microns. In other embodiments, the minimum gap may range from about 100 microns to about 200 microns. In various embodiments, the gap may be larger or smaller or varied around a perimeter of dies 610, 611, 680, 681 and windows 665, 666. In still other embodiments, the gap size may be determined, to some degree, by the size of the die pads or die mount structures (e.g., conductive die pads 272, FIG. 3) that would be used when mounting the dies 610, 611, 680, 681 to a conventional substrate (e.g., substrate 206, FIG. 3). For example, windows 665, 666 may have perimeters that track closely to the perimeters of the die pads to which the dies 610, 611, 680, 681 would be conventionally attached. Because die pads are typically slightly larger than their respective dies (e.g., as illustrated by die pads 272 of FIG. 3), this approach provides that windows 665, 666 are sized appropriately for installation of dies 610, 611, 680, 681 though windows 665, 666.

Figure 10:
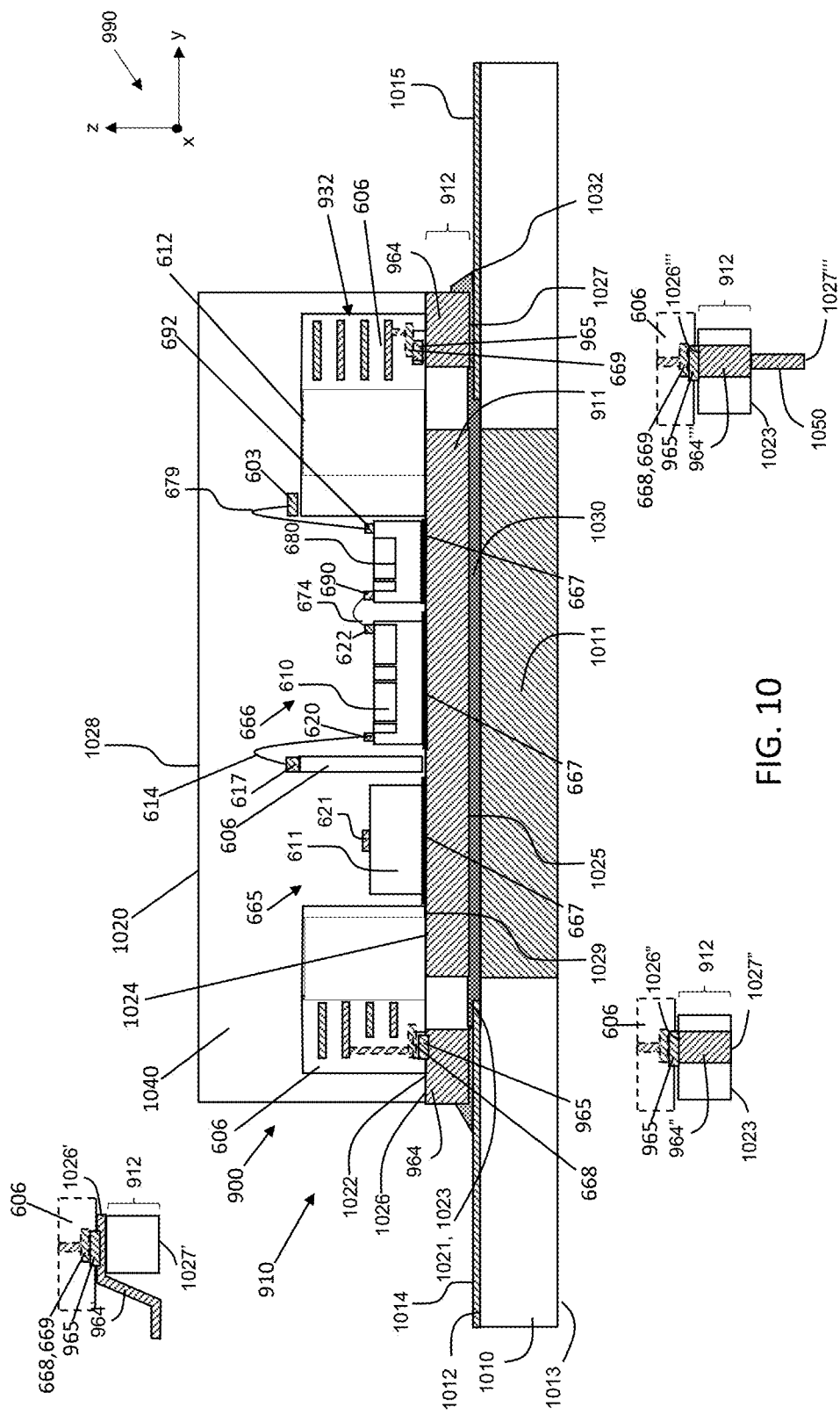
FIG. 10 is a cross-sectional, side view of the device of FIG. 9 taken along line 10-10.

Although the embodiment of substrate 606 depicted in FIGS. 6 and 7 shows single windows 665, 666 being formed in substrate 606 for each pair of individual dies 610, 680 and 611, 681 it should be understood that in some embodiments a single window may be defined for each individual die. For example, FIG. 7 depicts an alternate embodiment in which windows 660, 661, 662, 663 (dashed lines) are defined separately for each die 610, 611, 680, 681 within substrate 606. Still in other embodiments, substrate 606 may include a single window or opening arranged to surround all of the heat generating components of amplifier module 600 including each of dies 610, 611, 680, 681 and, potentially, additional heat-generating components such as controller dies, application specific integrated circuits (ASICs), and the like. As seen in FIG. 10 this substrate 606 configuration enables the heat-generating components of module 600 to be mounted through the substrate 606 windows directly to a thermally conductive central flange of a surface mount device. In some embodiments, windows are only provided for the high-power amplifier dies and other heat-generating dies or components, such as driver amplifier dies, may still be mounted on the module's substrate 606. In addition, although each of the illustrated windows is shown to fully surround the respective dies, in some embodiments, a window may be located at an edge of the module substrate 606, and one side of the window may be open so that a die (or combination of dies) positioned within such a window may be surrounded by substrate 606 on only three sides, with the remaining side being open.

In amplifier module 600, the power splitter 602, which is coupled to the mounting surface of the module substrate 606 and comprises an input circuit of module 600, may include one or more discrete die and/or components, although it is represented in FIG. 6 as a single element. The input circuit of module 200 may more generally be considered 'circuitry' or 'amplifier circuitry' that is coupled to the mounting surface 212 of the substrate 206. The power splitter 602 includes an input terminal and two output terminals. The input terminal of the power splitter 602 is electrically coupled through one or more conductive structures (e.g., vias, traces, and/or wirebonds) to the input terminal 601 and landing pad 668 to receive an input RF signal. The output terminals of the power splitter 602 are electrically coupled through one or more conductive structures (e.g., vias, traces 617, 637, and/or wirebonds 615, 614, 638, 639) to input terminals 620, 621 for the main and peaking amplifiers, respectively.

In the depicted Doherty amplifier configuration, the power splitter 602 is configured to split the power of the input RF signal received through the input terminal 601 into first and second RF signals, which are produced at the output terminals of the power splitter 602. In addition, the power splitter 602 may include one or more phase shift elements configured to impart about a 90 degree phase difference between the RF signals provided at the output terminals of the power splitter 602. The first and second RF signals produced at the outputs of the power splitter 602 may have equal or unequal power.

The first output of the power splitter is electrically coupled to the main amplifier path (i.e., to the main amplifier), and the second output of the power splitter is electrically coupled to the peaking amplifier path (i.e., to the peaking amplifier). In the illustrated embodiment, the RF signal produced at the second power splitter output is delayed by about 90 degrees from the RF signal produced at the first power splitter output. In other words, the RF signal provided to the peaking amplifier path is delayed by about 90 degrees from the RF signal provided to the main amplifier path.

The first RF signal produced by the power splitter 602 is amplified through the main amplifier path, which includes the driver stage die 610, the final stage die 680, and impedance inverter element 603 that includes an impedance inverter and phase shifter. The second RF signal produced by the power splitter 602 is amplified through the peaking amplifier path, which includes the driver stage die 611, the final stage die 681.

The first output of the power divider 602 is electrically coupled to an input terminal 620 of the driver stage die 610 (corresponding to a main amplifier input) through various conductive traces, circuitry, and wirebonds or other types of electrical connections, including wirebonds 615, conductive traces 617, and wirebonds 614 that connect between a contact pad on a surface of substrate 606 and input terminal 620. The driver stage die 610 and the final stage die 680 of the main amplifier path are electrically coupled together in a cascade arrangement between the input terminal 620 of the driver stage die 610 and an output terminal 692 of the final stage die 680 (corresponding to a main amplifier output). The driver stage die 610 includes the input terminal 620, an output terminal 622, an input impedance matching circuit 630, a power transistor 640, and an integrated portion of an interstage impedance matching circuit 650, in an embodiment.

The final stage die 680 includes an input terminal 690, an output terminal 692, and a power transistor 682. The output terminal 622 of the driver stage die 610 is electrically coupled to the input terminal 690 of the final stage die 680 through a wirebond array 674 or another type of electrical connection. The input terminal 690 is electrically coupled to the gate of the power transistor 682.

An amplified first RF signal is produced at the output terminal 692 of the final stage die 680. According to an embodiment, the output terminal 692 is electrically coupled (e.g., through wirebonds 679 or another type of electrical connection) to impedance inverter element 603. According to an embodiment, impedance inverter element 603 has a first end on the mounting surface 612 that is proximate to the output terminal 692 of the final stage die 680, and a second end on the mounting surface 612 that is proximate to the output terminal 693 of the final stage die 681. The impedance inverter element 603, along with the wirebonds 679, 604, may impart about a 90 degree relative phase shift to the amplified first RF signal as the signal travels from the phase shift element's first end to a combining node 605 coupled to its second end.

As mentioned above, the second RF signal produced by the power splitter 602 is amplified through the peaking amplifier path, which includes the driver stage die 611 and the final stage die 681. Accordingly, the second output of the power divider 602 is electrically coupled to an input terminal 621 of the driver stage die 611 through various conductive traces, circuitry, and wirebonds, including traces 637 and wirebonds 638 and 639, or another type of electrical connection.

The driver stage die 611 and the final stage die 681 of the peaking amplifier path are electrically coupled together in a cascade arrangement between an input terminal 621 of the driver stage die 611 (corresponding to a peaking amplifier input) and an output terminal 693 of the final stage die 681 (corresponding to a peaking amplifier output). The driver stage die 611 includes a plurality of integrated circuits. In an embodiment, the integrated circuitry of die 611 includes the input terminal 621, an output terminal 623, an input impedance matching circuit 631, a power transistor 641, and an integrated portion of an interstage impedance matching circuit 651, in an embodiment.

The final stage die 681 includes a plurality of integrated circuits. In an embodiment, the integrated circuitry of die 681 includes an input terminal 691, an output terminal 693, and a power transistor 683.

The output terminal 623 of the driver stage die 611 is electrically coupled to the input terminal 691 of the final stage die 681 through a wirebond array 675 or another type of electrical connection. The input terminal 691 is electrically coupled to the gate of the power transistor 683.

The signal path through the cascade-coupled peaking amplifier dies 611, 681 is in a direction extending from the RF input terminal 621 to the RF output terminal 693. Conversely, the signal path through the cascade-coupled main amplifier dies 610, 680 is in a direction extending from the driver stage die input terminal 620 to the final stage die output terminal 692. As can be seen in FIG. 6, the signal paths through the cascade-coupled peaking amplifier dies 611, 681 and the cascade-coupled main amplifier dies 610, 680 extend in significantly different directions, and more particularly the signal paths are orthogonal in the embodiment of FIG. 6. In other embodiments, the signal paths may be parallel.

In any event, the amplified second RF signal is produced by the final stage die 681 at the RF output terminal 693. According to an embodiment, the RF output terminal 693 is electrically coupled (e.g., through wirebonds 604 or another type of electrical connection) to the second end of the impedance inverter element 603. Accordingly, the amplified first RF signal produced by the final stage die 680 is conveyed to the RF output terminal 693, and the output terminal 693 functions as a summing node 605 for the amplified first and second RF signals. When the various phase shifts imparted separately on the first and second RF signals are substantially equal, the amplified first and second RF signals combine substantially in phase at summing node 605.

The RF output terminal 693 (and thus summing node 605) is electrically coupled (e.g., through wirebonds 607) to an output network 608 that may be located on the component mounting surface 612, and the output network 608 functions to present the proper load impedances to each of main and peaking amplifier dies 680, 681. In addition, the output network 608 may include a decoupling capacitor, as shown. Although the detail is not shown in FIG. 6, the output network 608 may include various conductive traces, additional discrete components, and/or integrated components (e.g., capacitors, inductors, and/or resistors) to provide the desired impedance matching. The output network 608 is electrically coupled through the substrate 606 to conductive output terminal 609, which is, in turn, connected to landing pad 669, which is exposed at the bottom surface of the substrate 606. The output terminal 609 functions as the RF output node for the Doherty power amplifier module 600 for outputting an amplifier output signal. In embodiments, the output network 608 of module 600 may more generally be considered 'circuitry' or 'amplifier circuitry' that is coupled to the mounting surface 612 of the substrate 606.

Figure 9:
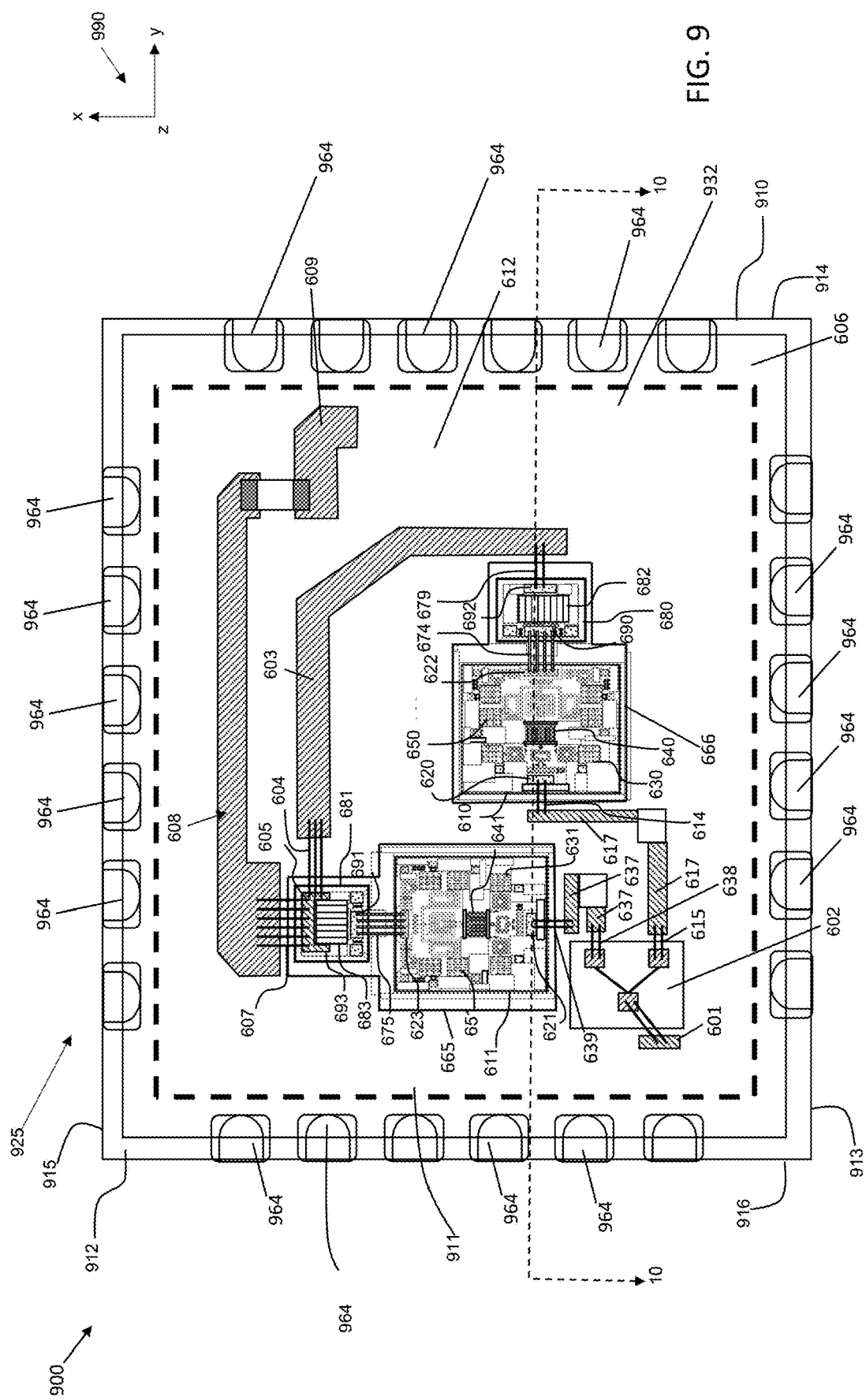
FIG. 9 is a top view of a surface-mount packaged amplifier device, in accordance with an example embodiment.

An embodiment of a surface-mount amplifier device module incorporating the amplifier module 600 of FIG. 6, will now be described in detail with reference to FIGS. 9-10. More specifically, FIG. 9 is a top view of a surface-mount packaged amplifier device 900, in accordance with an example embodiment, and FIG. 10 is a cross-sectional, side view of the device 900 of FIG. 9 along line 10-10. To enhance description of the relative orientations and directions of various elements of FIGS. 9 and 10, each of FIGS. 9 and 10 include a depiction of a three-dimensional Cartesian coordinate axis system 990, with orthogonal x-, y-, and z-axes depicted.

Amplifier device 900 includes a surface-mount package 910 in which RF amplifier module 932 (e.g., module 600, FIGS. 6, 8) is installed. RF amplifier module 932 has a similar configuration to the amplifier module 600 of FIGS. 6 and 8. Components within amplifier module 932 having the same element numbers as components within amplifier module 600 share the same configuration and corresponding description.

In the depicted embodiment, the surface-mount package 910 has a rectangular (e.g., square) perimeter defined by first, second, third, and fourth sides 913, 914, 915, 916 that extend between a top surface 1020 (FIG. 10) and an opposed bottom (or substrate-facing) surface 1021. The surface-mount package 910 includes a leadframe with a central thermal pad or flange 911 and a plurality of leads (e.g., leads 964), which are electrically isolated from each other and held in fixed orientation with respect to each other by a lower package body 912. The lower package body 912 has opposed top and bottom surfaces 1022, 1023, where the top surface 1022 of the lower package body 912 is internal to the package 910, and the bottom surface 1023 of the lower package body 912 also corresponds to the bottom surface 1021 of the overall package 910. According to an embodiment, the lower package body 912 may be formed from a molded plastic encapsulant material, although in other embodiments, the package body 912 may be formed from ceramic or another high-dielectric material.

The flange 911 is an electrically and thermally conductive, solid structure, which is centrally located in the lower package body 912, and which extends between the top and bottom surfaces 1022, 1023 of the lower package body 912. More particularly, a top surface 1024 of the flange 911 is co-planar with the top surface 1022 of the lower package body 912, and a bottom surface 1025 of the flange 911 is co-planar with the bottom surface 1023 of the lower package body 912 (and with the bottom surface 1021 of the package 910). The flange 911 may be formed, for example, from bulk conductive material (e.g., copper), which may or may not be plated. Alternatively, the flange 911 may be formed from a composite (e.g., layered or multi-part) conductive structure.

As will be discussed in more detail later, a portion of the bottom surface 1029 of the amplifier module 932 is physically, thermally, and, optionally, electrically connected (e.g., with a thermally and/or electrically conductive adhesive, a solder connection, conductive adhesive, brazing, sintering, or other materials) to the top surface 1024 of the flange 911, and the bottom surface 1025 of the flange 911 is physically, thermally, and optionally, electrically connected (e.g., with solder connection 1030, conductive adhesive, or other materials) to the top surface 1012 of a system substrate 1010 (as shown in FIG. 10). System substrate 1010 may further include a flange 1011 (e.g., a system substrate thermally conductive flange) that extends between the top and bottom surfaces 1012, 1013 of the substrate 510. When thermally coupled to flange 911, flange 1011 can operate as a heat sink to extract heat energy out of flange 911 and out of package 910.

Specifically, the bottom surface 1029 of the substrate 606 of amplifier module 932 is mounted to the flange 911.

Furthermore, because they are disposed through the windows 665, 666 of substrate 606, dies 610, 611, 680, 681 within amplifier module 932 are and thermally (and, optionally, electrically) connected directly to flange 911 (dies 611, 610, 680 positioned within windows 665, 666 are depicted in the cross-sectional view of FIG. 10), such as with a thermally-conductive die-attach material 667, sintering, solder die attach, and the like. In this configuration, the heat-generating dies 610, 611, 680, 681 of amplifier module 932 may be directly connected to flange 911 via a thermally-conductive die-attach material (e.g., thermally-conductive adhesive, solder material, etc.) to thermally couple dies 610, 611, 680, 681 to flange 911 thereby enabling heat energy generated by dies 610, 611, 680, 681 to be efficiently extracted out of amplifier module 932 through direct conductivity into flange 911. Additionally, in this configuration, flange 911 may be configured to act as a grounding structure enabling dies 610, 611, 680, 681 to be connected to flange 911 by a conductive material enabling flange 911 to operate as a ground node for dies 610, 611, 680, 681.

Sets of leads 964 are located at or proximate to each of the four sides 913-916 of the lower package body 912. Specifically, in FIG. 9, six aligned leads 964 are located at each of the four sides 913-916 of the lower package body 912. Alternatively, more or fewer leads 964 may be located at or proximate to each of the four sides 913-916. Sometimes alternatively referred to as "lands" or "pins", each of the leads 964 also are formed from bulk electrically conductive material (e.g., copper), which may or may not be plated. Alternatively, the leads 964 may be formed from a composite (e.g., layered or multi-part) conductive structure. Essentially, each lead 964 is a roughly cubic structure with a top surface 1026 (or an "internal end" or "proximal end") that is exposed at and/or co-planar with the top surface 1022 of the lower package body 912, a bottom surface 1027 (or an "external end" or "distal end") that is co-planar with the bottom surface 1023 of the lower package body 912 (and the bottom surface 1021 of the device 900), and four side surfaces extending between the top and bottom surfaces 1026, 1027. The internal end (e.g., the top surface 1026) of each lead 964 is at a height above the bottom surface 1021 of the device (and thus is at a height above the top surface 1012 of the system substrate 1010). According to an embodiment, this height, which essentially corresponds to the thickness of the leads 964 (i.e., the distance between the top and bottom surfaces 1026, 1027 of each lead), is in a range of about 0.2 millimeters (mm) to about 0.5 mm, in an embodiment, or from about 0.3 mm to about 0.4 mm, in a more specific embodiment. The bottom surface 1027 of each lead is exposed at the bottom surface 1023 of the lower package body 912 (and at the bottom surface 1021 of the device 900), and one of the side surfaces of each lead 964 may be exposed at a side 913-916 of the lower package body 912. In other embodiments, a side surface of a lead may not be exposed at a side 913-916 of the lower package body 912 (e.g., encapsulant material of the lower package body 912 may be present between the lead 964 and the sides 913-916 of the lower package body 912). Either way, the lead configuration ultimately facilitates robust connections (e.g., solder connections 1032 or connections to a socket) of the leads to conductive structures (e.g., traces 1014, 1015) at the top surface 1012 of the system substrate 1010. Considering the planes of the top surfaces 1020, 1028, 1012 of the device package 910, the amplifier module 932, and the system substrate 1010 to be "horizontal", each of the leads 964 may be considered to be a "vertical" conductor.

Although leads 964 are described to be roughly cubic structures that form portions of a leadframe, each lead 964 alternatively may have more or fewer than four sides, or may have shapes that are other than cubic. For example, in an alternate embodiment, the amplifier module 932 may be packaged in a Quad Flat Package (QFP). Essentially, a QFP differs from a QFN package in that the QFP includes gull wing leads (e.g., the gull wing lead 964' shown in the top left corner of FIG. 10, rather than bulk conductive leads 964 of a leadframe), which provide for electrical coupling between the amplifier module 932 and the system substrate 1010. As with a QFN package, a QFP package includes a thermal pad or flange (e.g., flange 911, FIG. 9), a plurality of leads (in this case, gull wing leads, such as the gull wing lead 964' shown in the top left corner of FIG. 10), and a package body that holds the flange and the leads in a fixed orientation with respect to each other. Each gull wing lead 964' includes an internal end 1026' (analogous to the top surface 1026 or internal or proximal end of leads 964), which can be embedded in the package body and coplanar with the top surface 1024 of the package 912, and an external end 1027' (analogous to the bottom surface 1027 or external or distal end of leads 964), which is external to the lower package body 912 and co-planar with the bottom surface 1023 of the lower package body 912. As will be explained in more detail below, in a QFP embodiment with gull wing leads, a distal end of a wirebond is connected to the elevated internal end 1026' of each gull wing lead 964', and the external distal end 1027' of the gull wing lead 964' is connected to a conductive structure (e.g., one of traces 1014, 1015 or other conductive structures) at the top surface 1012 of the amplifier module substrate 1010.

In still another alternate embodiment, the lower package body 912 may include a Land Grid Array (LGA), a Pin Grid Array (PGA), or a Ball Grid Array (BGA) that includes an array of lands, balls, or pins at the bottom surface 1023 of the lower package body 912. Two embodiments of LGA and PGA leads 964", 964''' are shown at the lower left and lower right corners of FIG. 10, respectively. LGA lead 964" is inset from the side of the lower package body 912, and extends between a top or proximal end 1026" at the top surface 1022 of the lower package body 912, and a bottom or distal end 1027" at the bottom surface of the lower package body 912. The bottom end 1027" functions as a land, that may be solder attached to a corresponding contact on the top surface of a PCB, or that may be contacted by a conductive pin protruding from the PCB. In some embodiments, such a conductive pin may protrude into the lead 964" (i.e., each lead 964" actually functions as a single-pin socket).

PGA lead 964''' also is inset from the side of the lower package body 912, and has a portion that extends between a top or proximal end 1026''' at the top surface 1022 of the lower package body 912 and the bottom surface 1023 of the lower package body 912. However, PGA lead 964''' also includes a pin 1050 that protrudes from the bottom surface 1023 of the lower package body 912, and an end 1027'''' of the pin 1050 corresponds to the bottom or distal end of the lead 964'''. The pin 1050 is configured to be received by a socket coupled to a PCB.

The amplifier module 932 includes the amplification circuitry (e.g., amplification stages 136, 137 or 156, 157, FIG. 1) of amplifier module 600. Specifically, a portion of the substrate 606 of amplifier module 932 is physically and electrically connected to the top surface 1024 of the flange 911 (e.g., using solder, thermally and/or electrically conductive adhesive, brazing, sintering, or other materials).

In addition to the amplifier module 600 being connected to package body 912, electrical connections are made between conductive terminals (e.g., via landing pads 668, 669) of amplifier module 932 and certain ones of the leads 964 to electrically connect such leads 964 to components of amplifier module 932. Specifically, landing pads 668, 669 are connected to the top surfaces 1026 (or to the internal or proximal ends) of certain ones of the leads 964 by conductive material 965 (e.g., solder or conductive adhesive). In other embodiments, as was discussed previously, the surface-mount package may be a QFP, LGA, or BGA package, and the landing pads 668, 669 are connected to the proximal ends 1026', 1026", 1026''' of the corresponding leads 964', 964", 964''' by conductive material 965. In some embodiments, the amplifier module 932, the wirebonds, the top surface 1022 of the lower package body 912, and the top surfaces 1026 (or internal or proximal ends) of the leads 964 that are not covered by the module 932 may then be overmolded with encapsulant material 1040. Alternatively, a protective cap may be attached to the top surface 1022 of the lower package body 912 to establish a sealed, internal air cavity that contains the amplifier module 932 and the wirebonds. In other words, the surface-mount package 910 also may be an air-cavity QFN package (or another type of surface-mount, air cavity package).

In an alternative embodiment of package 910, in which the package 910 does not include backside landing pads 668, 669, leads 964 may be electrically connected to components of package 910 via wirebond connections formed between one or more of leads 964 and electrical contact pads or terminals formed on mounting surface 612 of the substrate 606 of package 910. For example, in such an embodiment, input terminal 601 may be connected to a lead 964 by wirebond connection and, similarly, output terminal 609 may be connected to a lead 964 by wirebond connection.

As discussed above, the illustrated embodiment of amplifier module 932 embodies a dual-path RF Doherty amplifier. The amplifier includes signal splitter 602 on the component mounting surface 612 that is configured to receive an input RF signal via input terminal 601, which also may be present on the component mounting surface 612. Input terminal 601 is connected to one of the leads 964 via landing pad 668 and conductive material 965 (or any other suitable electrical interconnection). Amplifier module 932 also includes an output terminal 609 at which the amplified signal generated by amplifier module 932 is outputted. Output terminal 609 is connected to one of the leads 964 via landing pad 669 and conductive material 965 (or any other suitable electrical interconnection).

During operation of amplifier device 900 and, specifically, amplifier module 600 therein, heat generated by components of amplifier module 932 (and, specifically, driver and final stage transistors 610, 611, 680, 681 of amplifier module 932) is efficiently extracted out of those transistors and the dies in which they are implemented into central thermal pad or flange 911 of surface-mount package 910, and ultimately the flange 1011 of system substrate 1010.

Figure 11:
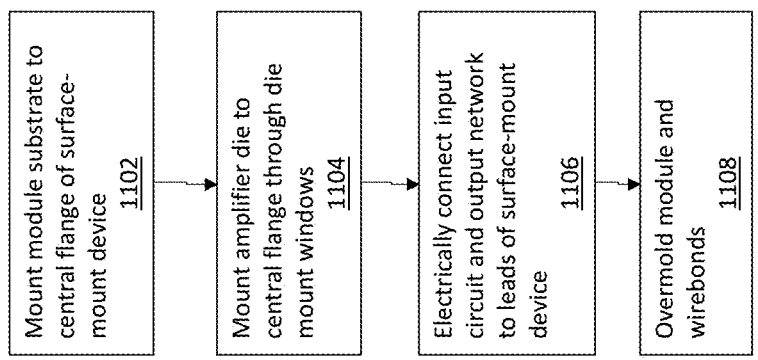
FIG. 11 is a flow charge depicting steps of a method to manufacture a surface-mount packaged amplifier device.
Figure 12:
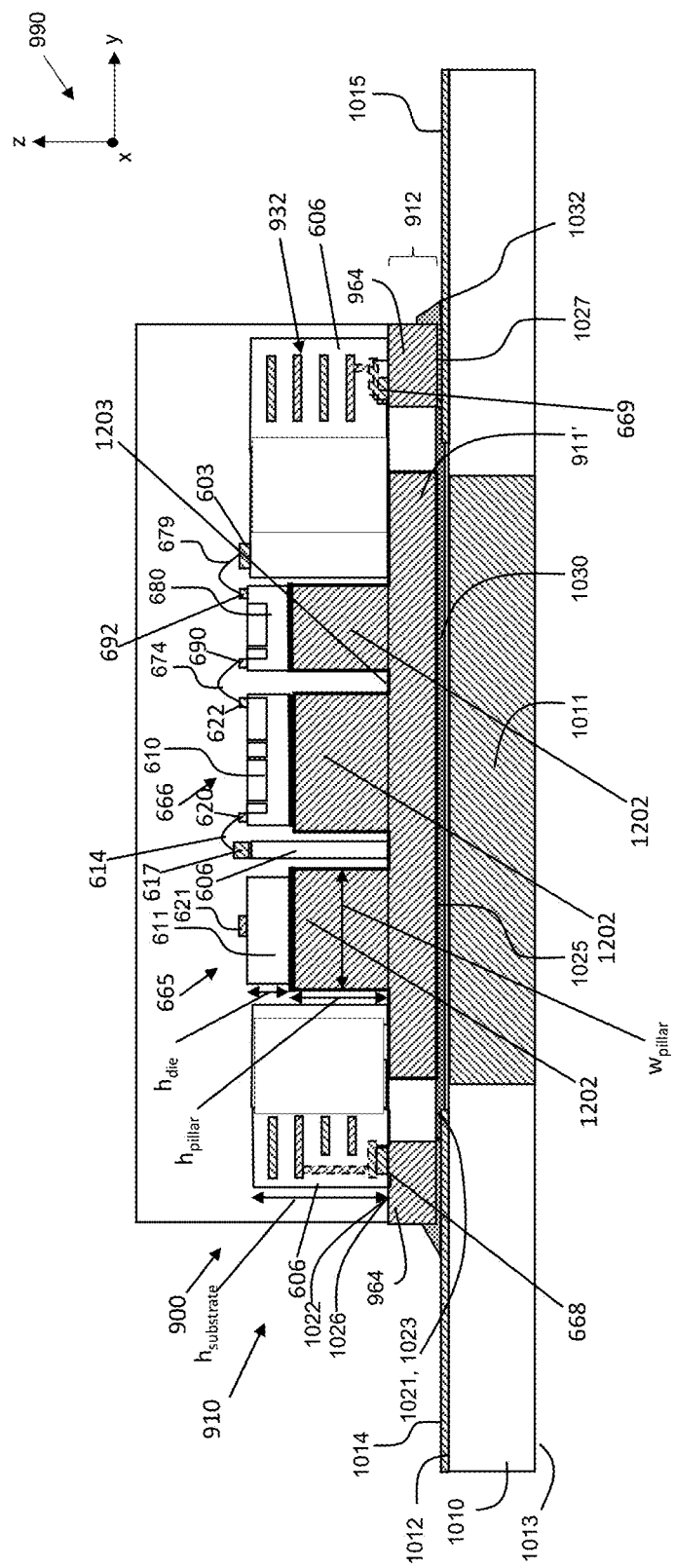
FIG. 12 depicts an embodiment of the device shown in FIGS. 9 and 10 wherein the flange of the surface mount package has a varied geometry.

FIG. 11 is a flowchart depicting a method of manufacturing device 900 depicted in FIGS. 9, 10, and 12. In a first step 1102, the module substrate 606 is mounted to the package body 912 of surface-mount package 910. Specifically, the landing pads (e.g., landing pads 668, 699 of amplifier module 600 may be affixed to certain leads 964 of package body 912 via conductive material 965 (e.g., solder or conductive adhesive)

With substrate 606 so mounted, in step 1104 dies 610, 611, 680, 681 are mounted to flange 911 through die attach windows 665, 666 defined by substrate 606. In this configuration, dies 610, 611, 680, and 681 do not physically contact substrate 606 and are instead directly physically mounted to the flange 911 using suitable thermally (and, optionally, electrically) conductive die-attach materials, such as a thermally conductive adhesive, sinter, and other die attach materials. Depending upon the application, the material used to mount the dies 610, 611, 680, and 681 to flange 911 may be electrically conductive, such as in cases where the flange 911 can operate as a ground node for the dies 610, 611, 680, and 681. It should be understood that in some embodiments, steps 1102 and 1104 may be reversed, so that dies 610, 611, 680, 681 are mounted to flange 911 first, with the module substrate 606 being mounted to the package body second. In such a case, when mounting module substrate 606, windows 665, 666 will be positioned so that the windows 665, 666 will fit around the previously mounted dies 610, 611, 680, 681. In still other embodiments, the mounting of dies 610, 611, 680, 681 and module substrate 606 to flange 911 and package body 912 may occur at substantially the same time with the components being mounted to 911 in substantially the same step.

When mounting the dies 610, 611, 680, and 681, various techniques may be utilized to provide that dies 610, 611, 680, and 681 are properly mounted through the die attach windows 665. 666. For example, in some instances, fiducials may be provided on the top surface of substrate 606 so that a die attach mechanism that incorporates a vision system can observe the fiducials on the substrate 606 and use the perceived location of those fiducials to properly position dies 610, 611, 680, and 681 within the die attach openings 665, 666.

With the substrate 606 and dies 610, 611, 680, and 681 properly mounted to the flange 911 of surface-mount package 910, in step 1106 wirebonds or other electrical connections may be formed to interconnect dies 610, 611, 680, and 681 and other components on substrate 606 of module 600.

In step 1108, substrate 606 (and components thereon), dies 610, 611, 680, and 681, and the wirebonds formed during step 1106 are overmolded to encapsulate those components into a finished surface-mount package 910. Alternatively, a protective cap may be attached to the top surface 1022 of the lower package body 912 to establish a sealed, internal air cavity that contains the amplifier module 932 and the wirebonds. That package 910 can then be mounted to other system components, such as a system PCB or substrate 1010 as depicted in FIG. 10.

As illustrated in the cross-sectional view of the amplifier module 932 of device 900 shown in FIG. 10, the wirebond arrays connecting dies 610, 611, 680, 681 to other components (e.g., wirebonds 639, 675, 607, 614, 674, and 679) may be required to be longer in order to compensate for the difference in height between the contact pads on the top surfaces of die 610, 611, 680, 681 and the contact pads on the external components and contact pads of the other components of amplifier module 932 to which dies 610, 611, 680, 681 are to be electrically connected. This variance in wirebond array length can affect the electrical performance of amplifier module 932. Specifically, because, in the configuration shown in FIG. 10, the length of wirebonds 679, 604, which connect impedance inverter element 603 to the output pads 692, 605 of dies 680, 681, is increased, the length of impedance inverter element 603 may be reduced to provide that the impedance inverter element 603, along with the lengthened wirebonds 679, 604, properly imparts about a 90 degree relative phase shift to the amplified first RF signal as the signal travels from the phase shift element's first end to a combining node 605 coupled to its second end. Accordingly, because the lengths of wirebonds 605, 679 may be increased, the configuration of impedance inverter element 603 may be adjusted (e.g., to have an electrical length that is less than 90 degrees or λ/4) to provide the desired electrical performance of amplifier module 932.

FIG. 12 depicts an alternative embodiment of the device 900 shown in FIGS. 9 and 10 wherein the top surface of the flange 911 of surface mount package 910 has a varied geometry configured to normalize (and/or reduce) the distance between contact pads on the dies 610, 611, 680, 681 of amplifier module 932 and surrounding components on the component mounting surface of the module substrate.

Specifically, FIG. 12 shows the same cross-sectional view of device 900 of FIG. 9, but with a modified flange 911' within surface mount package 910. As depicted, flange 911' includes a number of raised die attach pillars 1202 or projections. Pillars 1202 are positioned on flange 911' at locations underneath dies 610, 611, 680, 681 of amplifier module 932. As such, when device 900 is fabricated, each one of dies 610, 611, 680, 681 of amplifier module 932 is mounted to one of the raised pillars 1202.

The heights of each pillar 1202 can be selected so that the heights of the contact pads of each die 610, 611, 680, 681 within surface mount package 910 is equal to the heights of the contact pads of the other components or contact pads within amplifier module 932 are generally equal. In other words, the heights of each pillar 1202 may be configured so that the tops of the dies 610, 611, 680, 681 are approximately co-planar with the component mounting surface of the module substrate. To be specific, the height of the top surface of each pillar 1202 above the lower top surface 1203 of flange 911' is equal to the height of module substrate 606 minus the height of the die 610, 611, 680, 681 positioned within the windows of the module substrate. With reference to FIG. 12, for example, the height of each pillar $h_{pillar}$ above surface 1203 of flange 911' is equal to the thickness of substrate 606 $h_{substrate}$ minus the height of the corresponding die 610, 611, 680, 681 $h_{die}$.

In this configuration, the lengths of wirebonds 679 and other wirebonds connecting dies 610, 611, 680, 681 to other components of amplifier module 932 can be reduced as compared to the device 900 configuration depicted in FIGS. 9 and 10, while still allowing each one of dies 610, 611, 680, 681 to be directly connected to flange 911' of surface mount package 910 thereby realizing the improved heat extraction capabilities of the present package 910 design.

In various embodiments, the raised pillars 1202 of flange 911' may be formed by any suitable manufacturing process including etching or machining of flange 911', and in this manner the raised pillars 1202 of flange 911' may be formed integrally with the remainder of flange 911'. In some cases, pillars 1202 are separate thermally and/or electrically conductive structures (e.g., comprising metals, such as copper) that are attached to flange 911' via welding, thermal attach material, solder, sinter, or another process to provide that the separate pillars 1202 are securely attached to flange 911' and are able to efficiently conduct heat away from dies 610, 611, 680, 681 through pillars 1202 and into the remainder of flange 911'.

Each pillar 1202 is generally sized with lateral dimensions to correspond to the dimensions of dies 610, 611, 680, 681. Accordingly, the width $W_{pillar}$ and length (dimension into the page) of each pillar 1202, corresponding to the die attach surface, will generally match that of the corresponding die 610, 611, 680, 681.

Although in the embodiment depicted in FIG. 12 the height of pillars 1202 is selected to place the contact pads of dies 610, 611, 680, 681 at the same relative height as the other contact pads on the component mounting surface of substrate 606, which may operate to minimize the lengths of interconnecting wirebonds, in some implementations of device 900 different pillar 1202 heights may be utilized. For example, the height of pillars 1202 may be selected to achieve a desired ground loop geometry, where increasing the height of pillars 1202 can, in turn, increase the distance between the ground reference in flange 911' and the wirebonds connecting each of dies 610, 611, 680, 681 to other components on substrate 606. Alternatively, the heights of pillars 1202 may be selected so that a top surface of pillars 1202 is co-planar with a top surface of substrate 606.

Although this disclosure and Figures present embodiments of the present amplifier device in which the amplifier is configured in a Doherty architecture, it should be understood that in various embodiments, the present invention may be utilized in conjunction with amplifier modules (e.g., module 200, FIGS. 2 and 5, module 600, FIGS. 6 and 8) in which the amplifier modules comprise amplification circuitry that is not in a Doherty amplifier configuration. Furthermore, it should be understood that the present invention may be utilized to enable improved thermal management in non-amplifier applications. For example, as described herein, in various applications, non-amplifier circuit modules that include heat-generating components can be incorporated into the packaged surface mount devices (e.g., surface mount device 410, FIGS. 4, 5, surface mount package 910, FIGS. 9 and 10) in the manner disclosed herein (e.g., in conjunction with heat-generating dies 210, 211, 280, 281 and dies 610, 611, 680, 681) in various embodiments. As such, this disclosure is not limited to approaches for thermal management in Doherty-configured amplifiers and is applicable to other types of amplifiers and non-amplifier circuit modules.

In an embodiment, a system includes a system substrate having a top system substrate surface and a surface-mount device coupled to the top system substrate surface. The surface-mount device includes a central thermal pad, and an amplifier module mounted to the central thermal pad of the surface-mount device. The amplifier module includes a module substrate, a signal splitter mounted to a first surface of the module substrate, the signal splitter being configured to receive a radio frequency (RF) input signal at an input of the signal splitter and generate first and second RF output signals, a carrier amplifier mounted to the first surface of the module substrate in a first die mounting zone, the carrier amplifier being configured to receive the first RF output signal from the signal splitter and generate a first amplified RF output signal, a peaking amplifier mounted to the first surface of the module substrate in a second die mounting zone, the peaking amplifier being configured to receive the second RF output signal from the signal splitter and generate a second amplified RF output signal, and a combining node on the first surface of the module substrate, the combining node being configured to receive the first amplified RF output signal and the second amplified RF output signal and generate an amplifier output signal at an output terminal of the amplifier module.

In an embodiment, a surface-mount device includes a package body including a central flange and an amplifier module mounted to the central flange of the surface-mount device. The amplifier module includes a module substrate mounted to the central flange, the module substrate including a first die mount window, a first circuitry on a first surface of the module substrate, a second circuitry on the first surface of the module substrate, and a first amplifier die mounted on the central flange. The first amplifier die is at least partially disposed within the first die mount window and the first amplifier die is electrically connected to the first circuitry and the second circuitry. The first circuitry is electrically connected to a first lead of the package body and the second circuitry is electrically connected to a second lead of the package body.

In an embodiment, a method of manufacturing a surface-mount includes mounting a substrate to a central flange of the surface-mount device. The substrate includes a first circuitry and a second circuitry on a first surface of the substrate and a die mount window. The method includes mounting a first amplifier die to the central flange through the die mount window and electrically connecting the first amplifier die to the first circuitry and the second circuitry.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system, comprising:
    a system substrate having a top system substrate surface; and
    a surface-mount device coupled to the top system substrate surface, wherein the surface-mount device includes:
        a central thermal pad is configured to conduct heat to a heatsink, and
        an amplifier module mounted to the central thermal pad of the surface-mount device, the amplifier module comprising:
            a module substrate mounted to the central thermal pad;
            a signal splitter mounted to a first surface of the module substrate, the signal splitter being configured to receive a radio frequency (RF) input signal at an input of the signal splitter and generate a first RF output signal and a second RF output signal;
            a carrier amplifier mounted to the first surface of the module substrate in a first die mounting zone, the carrier amplifier being configured to receive the first RF output signal from the signal splitter and generate a first amplified RF output signal;
            a peaking amplifier mounted to the first surface of the module substrate in a second die mounting zone, the peaking amplifier being configured to receive the second RF output signal from the signal splitter and generate a second amplified RF output signal; and
            a combining node on the first surface of the module substrate, the combining node being configured to receive the first amplified RF output signal and the second amplified RF output signal and generate an amplifier output signal at an output terminal of the amplifier module.

2. The system of claim 1, wherein the module substrate further comprises:
    a first landing pad on a second surface of the module substrate, the second surface of the module substrate being opposite the first surface of the module substrate; and
    a second landing pad on the second surface of the module substrate and wherein, the first landing pad is electrically connected to a first lead of the surface-mount device and the input of the signal splitter and the second landing pad is electrically connected to a second lead of the surface-mount device and the output terminal of the amplifier module.

3. The system of claim 1, wherein the module substrate includes thermally conductive trenches extending from the first surface of the module substrate to a second surface of the module substrate, wherein the second surface is opposite the first surface and the thermally conductive trenches are formed within the first die mounting zone and the second die mounting zone.

4. The system of claim 3, wherein the carrier amplifier is thermally coupled to the thermally conductive trenches within the first die mounting zone by a first thermally conductive material and the peaking amplifier is thermally coupled to the thermally conductive trenches within the second die mounting zone by a second thermally conductive material.

5. The system of claim 3, wherein the system substrate includes a system substrate thermally conductive flange and the system substrate thermally conductive flange is thermally coupled to at least one of the thermally conductive trenches.

6. A surface-mount device, comprising:
a package body including a central flange configured to conduct heat to a heatsink; and
an amplifier module mounted to the central flange of the surface-mount device, the amplifier module comprising:
a module substrate mounted to the central flange, the module substrate including a first die mount window,
a first circuitry on a first surface of the module substrate,
a second circuitry on the first surface of the module substrate, and
a first amplifier die mounted directly to the central flange, wherein the first amplifier die is at least partially disposed within the first die mount window and does not physically contact the module substrate and the first amplifier die is electrically connected to the first circuitry and the second circuitry, and wherein the first circuitry is electrically connected to a first lead of the package body and the second circuitry is electrically connected to a second lead of the package body.

7. The surface-mount device of claim 6, wherein the module substrate further comprises:
a first landing pad on a second surface of the module substrate, the second surface of the module substrate being opposite the first surface of the module substrate; and
a second landing pad on the second surface of the module substrate and wherein, the first landing pad is electrically connected to the first lead and the first circuitry and the second landing pad is electrically connected to the second lead and the second circuitry of the amplifier module.

8. The surface-mount device of claim 7, wherein the first lead and the second lead are selected from Quad Flat No-Lead (QFN) package leads, gull wing leads, Land Grid Array (LGA) package leads, and Ball Grid Array (BGA) package leads.

9. The surface-mount device of claim 6, wherein the first amplifier die is thermally coupled to the central flange by a first thermally conductive material.

10. The surface-mount device of claim 6, wherein the module substrate includes a second die mount window and further comprising a second amplifier die mounted to the central flange, wherein the second amplifier die is at least partially disposed within the second die mount window and the second amplifier die is electrically connected to the first circuitry and the second circuitry.

11. The surface-mount device of claim 10, wherein the first amplifier die includes a carrier amplifier of a Doherty amplifier device, and the second amplifier die includes a peaking amplifier of the Doherty amplifier device.

12. The surface-mount device of claim 6, wherein the central flange includes a die attach pillar and the first amplifier die is mounted to the die attach pillar of the central flange.

13. The surface-mount device of claim 12, wherein a height of the die attach pillar is equal to a height of the module substrate minus a height of the first amplifier die.

14. The surface-mount device of claim 12, wherein the die attach pillar is formed integrally with the central flange.

15. The surface-mount device of claim 6, wherein the central flange includes a thermally and electrically conductive material.

16. The surface-mount device of claim 15, wherein the first amplifier die is not in direct physical contact with the module substrate.

17. A method of manufacturing a surface-mount device, comprising:
mounting a substrate to a central flange of the surface-mount device, wherein the central flange is configured to conduct heat to a heatsink, wherein the substrate includes a first circuitry and a second circuitry on a first surface of the substrate and a die mount window;
mounting a first amplifier die to the central flange through the die mount window; and
electrically connecting the first amplifier die to the first circuitry and the second circuitry.

18. The method of claim 17, wherein mounting the first amplifier die to the central flange includes disposing a thermally conductive die attach material between the first amplifier die and the central flange of the surface-mount device.

19. The method of claim 17, further comprising:
electrically connecting the first circuitry to a first lead of the surface-mount device; and
electrically connecting the second circuitry to a second lead of the surface-mount device.

20. The method of claim 19, further comprising overmolding the first circuitry, the second circuitry, and the first amplifier die.

* * * * *